(12) United States Patent
Yoon

(10) Patent No.: US 7,649,478 B1
(45) Date of Patent: Jan. 19, 2010

(54) DATA ENTRY USING SEQUENTIAL KEYSTROKES

(76) Inventor: Hyoungsoo Yoon, 1030 E. El Camino Real, #162, Sunnyvale, CA (US) 94087

( * ) Notice: Subject to any disclaimer, the term of this patent is extended or adjusted under 35 U.S.C. 154(b) by 526 days.

(21) Appl. No.: 11/555,986

(22) Filed: Nov. 2, 2006

Related U.S. Application Data

(60) Provisional application No. 60/825,127, filed on Sep. 9, 2006, provisional application No. 60/824,606, filed on Sep. 5, 2006, provisional application No. 60/732,478, filed on Nov. 3, 2005.

(51) Int. Cl.
*H03M 11/00* (2006.01)
*H03K 17/94* (2006.01)

(52) U.S. Cl. .............. 341/22; 341/65; 341/67; 341/107; 345/168

(58) Field of Classification Search .......... 341/22, 341/65, 67, 107; 345/168
See application file for complete search history.

(56) References Cited

U.S. PATENT DOCUMENTS

| | | | |
|---|---|---|---|
| 4,379,288 A | 4/1983 | Leung et al. | |
| 4,381,502 A | 4/1983 | Prame | |
| 4,490,056 A | 12/1984 | Whitaker | |
| 4,670,890 A * | 6/1987 | Titchener | 375/359 |
| 5,184,315 A | 2/1993 | Lapeyre | |
| 5,258,748 A | 11/1993 | Jones | |
| 5,642,108 A | 6/1997 | Gopher et al. | |
| 5,786,776 A | 7/1998 | Kisaichi et al. | |
| 5,952,998 A | 9/1999 | Clancy et al. | |
| 5,982,303 A | 11/1999 | Smith | |
| 6,005,495 A | 12/1999 | Connolly et al. | |
| 6,009,444 A | 12/1999 | Chen | |
| 6,016,142 A | 1/2000 | Chang et al. | |
| 6,142,687 A | 11/2000 | Lisak | |
| 6,204,848 B1 | 3/2001 | Nowlan et al. | |
| 6,219,731 B1 | 4/2001 | Gutowitz | |
| 6,281,812 B1 | 8/2001 | Kim | |
| 6,378,234 B1 | 4/2002 | Luo | |
| 6,459,390 B1 | 10/2002 | Kim | |
| 6,467,924 B2 | 10/2002 | Shipman | |
| 6,542,091 B1 | 4/2003 | Rasanen | |
| 6,608,271 B2 | 8/2003 | Duarte | |
| 6,648,530 B2 | 11/2003 | Kamei et al. | |
| 6,681,002 B2 | 1/2004 | Chang | |
| 6,690,306 B1 | 2/2004 | Acharya et al. | |
| 6,731,227 B2 | 5/2004 | Horie | |
| 6,744,422 B1 | 6/2004 | Schillings et al. | |
| 6,765,503 B1 | 7/2004 | Chan et al. | |
| 6,765,554 B2 | 7/2004 | Millington | |
| 6,765,556 B2 | 7/2004 | Kandogan et al. | |
| 6,802,661 B1 | 10/2004 | Lee et al. | |
| 6,830,396 B2 | 12/2004 | Kurriss | |

(Continued)

*Primary Examiner*—Timothy Edwards, Jr.

(57) ABSTRACT

A method for designing a keyboard for efficient data entry. A user inputs data from a predefined set of characters such as letters or symbols on an input device by pressing one or more keys, in a sequential fashion, for each character. Based on the frequency of occurrence for each character, a prefix-free coding is used to generate an optimal or near-optimal key sequence mapping for the given character set. In one exemplary embodiment, eight to twelve keys from a phone keypad are used to generate English alphabets, which substantially reduces the average number of keystrokes per character. The present invention enables the user to efficiently input typical data from a given probability distribution of characters using a limited number of keys.

20 Claims, 32 Drawing Sheets

U.S. PATENT DOCUMENTS

| | | |
|---|---|---|
| 6,847,706 B2 | 1/2005 | Bozorgui-Nesbat |
| 6,857,800 B2 | 2/2005 | Zhang et al. |
| 6,864,809 B2 | 3/2005 | O'Dell, et al. |
| 6,882,869 B1 | 4/2005 | Toebes et al. |
| 6,885,318 B2 | 4/2005 | Bickerton |
| 6,952,173 B2 | 10/2005 | Miller |
| 6,992,658 B2 | 1/2006 | Wu et al. |
| 7,008,127 B1 | 3/2006 | Kurriss |
| 7,027,037 B2 | 4/2006 | Dowd |
| 7,088,341 B2 | 8/2006 | Koch et al. |
| 7,104,711 B2 | 9/2006 | Kurriss |
| 7,113,172 B2 | 9/2006 | Hohl et al. |
| 2004/0006569 A1* | 1/2004 | Carlin et al. ............... 707/101 |
| 2009/0073007 A1* | 3/2009 | Jia ............................ 341/67 |

* cited by examiner

| Digit | Frequency |
|---|---|
| 0 | 13.1 % |
| 1 | 12.4 % |
| 2 | 11.7 % |
| 3 | 11.0 % |
| 4 | 10.3 % |
| 5 | 9.7 % |
| 6 | 9.0 % |
| 7 | 8.3 % |
| 8 | 7.6 % |
| 9 | 6.9 % |

1442

| Digit | Key Sequence |
|---|---|
| 0 | X X X |
| 1 | X X Y |
| 2 | Y X X |
| 3 | Y X Y |
| 4 | Y Y X |
| 5 | Y Y Y |
| 6 | X Y X X |
| 7 | X Y X Y |
| 8 | X Y Y X |
| 9 | X Y Y Y |

1582

| Alphabet | Key Sequence |
|---|---|
| a | 2 2 |
| b | 3 9 |
| c | 2 7 |
| d | 2 4 |
| e | 4 |
| f | 2 8 |
| g | 3 6 |
| h | 2 5 |
| i | 8 |
| j | 3 3 5 |
| k | 3 3 3 |
| l | 2 6 |
| m | 3 4 |
| n | 6 |
| o | 9 |
| p | 2 9 |
| q | 3 3 4 |
| r | 7 |
| s | 2 3 |
| t | 5 |
| u | 3 2 |
| v | 3 8 |
| w | 3 7 |
| x | 3 3 2 |
| y | 3 5 |
| z | 3 3 6 |

| Alphabet | Key Sequence |
|---|---|
| a | 9 |
| b | 2 4 |
| c | 1 4 |
| d | 1 1 |
| e | 3 |
| f | 1 5 |
| g | 2 1 |
| h | 1 2 |
| i | 7 |
| j | 2 8 |
| k | 2 6 |
| l | 1 3 |
| m | 1 8 |
| n | 5 |
| o | 8 |
| p | 1 6 |
| q | 2 7 |
| r | 6 |
| s | 0 |
| t | 4 |
| u | 1 7 |
| v | 2 3 |
| w | 2 2 |
| x | 2 5 |
| y | 1 9 |
| z | 2 9 |

| Alphabet | Sequence |
|---|---|
| a | 7 |
| b | 0 * |
| c | 0 1 |
| d | 9 |
| e | 1 |
| f | 0 2 |
| g | 0 7 |
| h | * |
| i | 5 |
| j | 0 0 3 |
| k | 0 0 1 |
| l | # |
| m | 0 5 |
| n | 3 |
| o | 6 |
| p | 0 3 |
| q | 0 0 2 |
| r | 4 |
| s | 8 |
| t | 2 |
| u | 0 4 |
| v | 0 9 |
| w | 0 8 |
| x | 0 # |
| y | 0 6 |
| z | 0 0 4 |

1684

| Symbol | Sequence |
|---|---|
| ! | 0 0 0 8 |
| " | 0 0 7 |
| $ | 0 0 0 2 |
| % | 0 0 0 9 |
| & | 0 0 0 7 |
| ' | 0 0 9 |
| ( | 0 0 # |
| ) | 0 0 0 1 |
| * | 0 0 0 4 |
| + | 0 0 0 * |
| , | 0 0 5 |
| - | 0 0 8 |
| . | 0 0 6 |
| / | 0 0 0 6 |
| : | 0 0 * |
| ; | 0 0 0 3 |
| < | 0 0 0 0 |
| > | 0 0 0 # |
| ? | 0 0 0 5 |

DATA ENTRY USING SEQUENTIAL KEYSTROKES

CROSS REFERENCE TO RELATED APPLICATIONS

The present application claims priority to co-pending U.S. Provisional Patent Application No. 60/732,478 filed on Nov. 3, 2005 and entitled "Method and Apparatus for Data Entry Using Sequential Keystrokes", co-pending U.S. Provisional Patent Application No. 60/824,606 filed on Sep. 5, 2006 and entitled "Method and Apparatus for Data Entry Using Multiple Keys", and co-pending U.S. Provisional Patent Application No. 60/825,127 filed on Sep. 9, 2006 and entitled "System and Method for Configuring Keyboard for Efficient Typing", each of which is incorporated herein by reference in its entirety; this application hereby claims the benefit of these provisional applications under 35 U.S.C. § 119(e).

BACKGROUND OF THE INVENTION

1. Field of the Invention

The present invention generally relates to keyboards, typewriters, or data entry devices. More particularly, this invention pertains to methods and apparatuses for generating characters, or character signals, or other input signals to data processing or communications systems by actuating one or more keys.

2. Description of the Related Art

Data-processing devices such as digital computers use internal character sets to represent data or to communicate with other devices. These character sets, or code pages as is sometimes known, contain letters in natural languages as well as some additional characters such as numbers and punctuation symbols (and other "non-printable" characters, etc.). A character set corresponding to a European language typically consists of order of 100 to 200 characters (e.g., letters, symbols, etc.). Character sets corresponding to some languages such as Chinese, Korean, and Japanese, however, contain thousands of characters or more. A standard character set known as Unicode can represent millions of characters from (virtually) all known country- and language-specific character sets. In some cases, different character sets (and/or encoding schemes, etc.) are used for different purposes, for example, for internal use, for transmitting data, and so forth.

A user typically enters data or other input signals (e.g., sequences of characters) using a keyboard or keypad device that includes keys or buttons for entering individual characters or for modifying typed characters, etc. For entering English alphabets on data processing systems such as personal computers (PCs), most keyboards use about 100 keys arranged in a well known "QWERTY" layout. Most keys in commonly used keyboards typically have a one-to-one mapping (or, one-to-few mapping, when modifier keys are used, etc.) to characters from (a subset of) the internal character set. For example, a single key is assigned to a single alphabet (lower-case and upper-case) in many English keyboards. Another popular device for inputting alphabets is a numeric keypad having at least 12 keys, numbers 0 through 9 and * and #. The numeric keypad was originally designed to key in telephone numbers. But, due to recent technological advances, especially in the areas of data communications, this keypad design has been widely used for inputting other letters or symbols in many mobile devices. In the so-called Multi-Tap mode, for example, English alphabets are generated by pressing appropriate numerical keys for a predetermined number of times, usually one to three times.

As the size of a keyboard or keypad (or, the device on which the keypad is disposed) decreases, and hence, as the ratio between the number of characters to be represented/encoded and the number of keys available on the keypad increases, it becomes more difficult to represent characters in an efficient way. For a mobile device, additional challenges are, among other things, (1) the device's form factor (or, the keypad's size) is relatively small and each key has to be much smaller than its counterpart in bigger devices or bigger keyboards, and (2) the user might not be able to use all fingers, or even two hands, under many circumstances where the device is typically used. For most small mobile phones, English alphanumeric characters are typically entered by the user using only one or few fingers or thumbs. It is, therefore, considered desirable to have the ability to efficiently input (a certain subset of) alphabetic letters or symbols (or, other input signals, such as control characters, navigation signals, etc.) into a device which is too small, or otherwise too inconvenient, to permit use of (a portion of) a "full-size" keyboard (e.g., keyboard possessing full-size keys with each key dedicated to one or two letters, etc.).

In order to facilitate inputting more characters than would be possible on a small (conventional) keyboard, various methods of using multiple keys (or, multiple key presses or keystrokes), in a sequential fashion, to represent a single letter have been developed, including the aforementioned Multi-Tap mode. These methods generally fall into the following three categories (or, certain combinations of the three): (1) Using a "prefix". A prefix key is not considered a character, and a character is parsed based on the prefix and the subsequently typed one or more keys. One of the most popular variants of these prefix keys are those modifier keys such as Shift, Ctrl, or Alt keys typically found on PC keyboards, which modify the generated signal of a key (e.g., when pressed together with the key, etc.). A prefix can be a sequence of one or more predetermined keystrokes. (2) Using a fixed predetermined number of keys to represent a character. Character is parsed based on the set of keys as a whole. This facilitates easy parsing since the character code needs to be generated only when the preset number of keystrokes are observed/received. This is sometimes known as fixed-length encoding in the field of data communications. (3) Using a special marker to denote character boundaries. For example, pressing a special key (or, postfix key) or pausing for a predetermined time interval marks the end of a character and beginning of a new character. The multi-tap mode, for example, uses a pause of 0.5 or 1.0 second to demarcate the boundaries between the characters which use the same keys. This forced pause is one of the main limitations of the multi-tap mode: The typing speed is inherently limited by the pauses between the characters.

Morse code used in radio communications may be viewed as a sequential keystroke coding scheme. Morse code uses one key, or more precisely, two signals, a "dot" and a "dash", and various lengths of pauses or gaps. Different intervals of pauses are used to separate key signals, characters, words, and sentences, etc. Morse code essentially belongs to the category (3) mentioned above if we view a telegraphy device as a two-key keypad, one for a dot and the other for a dash. (It should be noted, however, that a telegraphy device is not considered a keyboard (in general or in the pertinent arts, etc.) and that this analogy should not be taken too literally.) To illustrate the importance of the pauses or character boundary markers, FIGS. 1A-1D show the same sequences of a dot 1104 and two dashes, 1106 and 1108, with different intervals or gaps between them. These sequences are depicted against an arbitrary linear time axis 1102, which has appropriate marks in each figure. FIG. 1A shows a letter, 'w', FIG. 1B shows 'a' followed by 't', FIG. 1C shows 'e' followed by 'm', and FIG. 1D shows a sequence of three characters, 'e', 't', and 't', according to the International Morse Code.

Certain embodiments of the present invention utilize another type of mapping between sequential keystrokes and characters based on the so-called prefix-free encoding. A prefix-free code is a code constructed so that dividing the code word (e.g., corresponding to a single letter) into two pieces cannot result in the first being a code word, and it is typically used in electronic communications and, in particular, for data compression. The basic idea of some embodiments of the present invention is that we view the character-keystroke mapping as an encoding of characters using the available keys on a keyboard (e.g., using a particular encoding scheme, etc.). Then the design of a keyboard (or, keyboard layout) becomes the problem of finding an (optimal, near-optimal, or otherwise efficient) encoding scheme for the given character set with the available keys.

At least one embodiment of the present invention teaches how to systematically design or configure efficient and/or optimal keyboards based on prefix-free encoding utilizing the information regarding the character occurrence frequencies. It is well recognized that not all letters/symbols in a character system occur with the same (average) frequency in a typical written (or, colloquial) text. In the modern English language, for example, letter E occurs most frequently (about 13% of the times) among 26 alphabets, and letter Z appears least frequently (about 0.1% of the time). In general, the most frequently used character/symbol in any written language is a space. Most keyboards and data-entry devices and methods, however, do not take this fact into account and there is no or little correlation between the frequency of occurrence of characters and the key arrangement or the like. (Most notable exception may be the "huge" spacebar key found in typical typewriters or computer keyboards, which can often be pressed with a thumb of either hand. Also, certain frequently used keys such as Enter or Shift tend to have slightly bigger sizes than other keys.) For example, the "QWERTY" keyboard was developed in the early days of mechanical typewriters, mainly to minimize mechanical jamming instances associated with typing English letters. Accordingly, the inefficient arrangement of the letters on the keys leads to longer data entry time. (It should noted, however, that a certain group of letters (e.g., lower-case alphabets) are easier to type (e.g., a single keystroke) than other group of letters (e.g., certain symbols) which require activation of more than one key. This design reflects the fact that lower-case alphabets overall occur more frequently than other symbols.) This problem is more pronounced for smaller devices, where more than one keystrokes may be required for inputting a character. Most widely used typing schemes on a numerical keypad or 12-digit phone keyboard (e.g., using the multi-tap mode, etc.) use a simple key arrangement based on the alphabetical order. This is illustrated in FIG. 1E. The figure shows a keypad 1132 (or, a part of a keypad) where twelve keys 1134 are arranged in a 4 row by 3 column matrix. The keys '2' through '9' are typically used for representing alphabets. The rest four keys are sometimes used for other commonly used symbols such as '@', ',', '.', or a space.

In view of the above limitations, it is an object of at least one embodiment of the present invention to provide an improved method and system for designing efficient and/or optimal keyboards. It is another object of a certain embodiment of the present invention to provide a system for obtaining keyboards or keyboard layouts that are efficient, useful, and easy to learn. It is yet another object of some embodiments of the present invention to provide a system to design/configure keyboards that do not require simultaneous actuation of multiple keys, i.e., simultaneous keystrokes. It is yet another object of certain embodiments of the present invention to provide keyboards/keypads that are more efficient as they are biased on both frequency and alphabetical basis. It is yet another object of certain embodiments of the present invention to provide keyboards providing all or a majority of characters in a character set with less number of keys than the number of characters. It is yet another object of some embodiments of the present invention to provide keyboards that can be effectively operated with one hand or with one or a few fingers or thumbs so that the keyboard is suitable to both handheld devices and other bigger devices which may be effectively operated by people lacking the full use of both hands or all fingers. More specifically, it is an object of certain embodiments of the present invention to provide a system and method to design or configure a keyboard, and a keyboard apparatus of such design or configuration, which has a minimal or near-minimal number of keystrokes per character when averaged over alphabet/letter space in a relevant context or lexical domain, thereby minimizing or reducing the average time to type typical sentences using those keyboards. It is yet another specific object of certain embodiments of the present invention to provide a system and method to design or configure a keyboard, and such a keyboard apparatus thereof, which has minimal or near-minimal learning barrier and requires as little time and effort for a new user to become proficient. It is yet another specific object of certain embodiments of the present invention to provide a system and method to design or configure a keyboard, and such a keyboard apparatus thereof, for which it is easy to figure out the key sequence for a target alphabet or other letter (e.g., based on cues such as key labels, etc.). These and other objects and advantages of the present invention will become apparent from a review of the following specification and accompanying drawings. The foregoing objects are some of but a few of the goals that may be attained by the present invention.

BRIEF SUMMARY OF EXEMPLARY EMBODIMENTS

At least one embodiment of the present invention teaches how to systematically design or configure an efficient and/or optimal sequential keystroke keyboard utilizing a prefix-free encoding, which is typically used in communications, for example, for purposes of data compression. In an embodiment of the present invention, a character-keystroke sequence mapping is devised as if characters are "encoded" using a set of keys (available on a target keyboard, etc.). Then the keyboard design includes a problem of finding an optimal (or, otherwise efficient) encoding scheme for the given character set with the available keys. In embodiments of the present invention, a user inputs data from a predefined set of characters on an input device with a limited number of keys by pressing one or more keys, in a sequential fashion, for each character. According to an embodiment of the present invention, the character vs. key sequence mapping is devised so that the average time to type typical sentences is minimized (or, otherwise reduced). In a certain embodiment, the character mapping is optimized so that the average number of keystrokes is reduced over a target lexical domain. In some embodiments, the keys are further arranged (e.g., on a keypad) to make them easy to type as well as easy to learn.

According to an embodiment of the present invention, for a given set of keys, prefix-free coding is used to generate the keystroke sequence (or, simply key sequence, for short) for a given character. A prefix-free code is a code constructed so that dividing a code word into two pieces cannot result in the first piece being a valid code word. This property permits proper framing of transmitted code words when (a) external synchronization is provided to identify the start of the first code word in a sequence of code words and (b) no uncorrected errors occur in the symbol stream. In a certain embodiment of the present invention, a particular prefix-free encoding, known as Huffman coding, is used based on the frequency of each character in a language context or lexical domain or corpus to generate the optimal or near-optimal key sequences for the given character set. Huffman code is known to be optimal under certain conditions. Various other coding schemes have been devised, some of which are proven to be optimal under different conditions and constraints. Certain embodiments of the present invention enable the user to efficiently input a typical data (e.g., from a given probability distribution of characters, etc.) using a limited number of keys. Some device embodiments of the present invention can be operated by a single hand or even by a single finger. In a certain embodiment of the present invention, an error handling method is provided to deal with cases when an invalid keystroke sequence is inputted.

According to an embodiment of the present invention, a sequential keystroke keyboard is designed (or, configured) based on Huffman coding (or, other prefix-free encoding) according to the following series of operations: (1) First, define a keyboard with a fixed number of keys (e.g., arranged, or to be arranged, in a substantially regular grid pattern, etc.). In some embodiments, keys are assumed be binary, and it is further assumed that all keys are equivalent in terms of the cost of typing. In a certain embodiment, a keystroke is defined to be a key press and release event. In a certain other embodiment, a keystroke event is defined to occur when a key is pressed (or, released). (2) Next, identify a set of characters (e.g., letters, numbers, symbols, etc.) to be encoded. This set is typically domain specific. For example, a set of all printable ASCII characters may be used in designing general-purpose English language keyboards. (3) Then, obtain the data regarding frequencies of occurrence of all characters in the given character set. This can be done by collecting enough "sample writings" from the given domain of usage, and counting each character (e.g., using a computer program, etc.). In a certain embodiment, (normalized) weights (e.g., derived from the frequency chart, etc.) are used instead. (4) Once this probability/weight distribution (e.g., over the set of characters) is obtained, use Huffman encoding (or, other prefix-free encoding) to map keystroke sequences to specific characters. (5) Finally, keys may be arranged, or re-arranged, in a keyboard in a particular pattern. In some embodiments, keys are arranged so that keys used more frequently are put closer to each other (e.g., to facilitate easy typing, etc.). In some cases, more frequently used keys are put into a particular section of the keypad area, such as an area around the upper left corner of the keypad, etc.

In one exemplary embodiment of the present invention, eight keys from a phone keypad (e.g., comprising 12 keys) are pressed no more than three times to generate lower-case English alphabets. These eight keys can be, for example, those keys used to type in alphabets in Multi-tap mode (e.g., as shown FIG. 1E). This embodiment can be used as a part of more general encoding/mapping scheme where some type of context dependent mode switching is implemented. In this particular embodiment, for example, this sequential key mapping may be activated once a user enters a text mode. Also, a special prefix/modifier key may be used to input the capital letters corresponding to the lower-case letters encoded by sequential keystrokes (or, simply keystrokes, for short). In another exemplary embodiment, ten keys from a numeric keypad, for example corresponding to digits from 0 to 9, are used to reduce the maximum number of keystrokes per character to two (e.g., even for the least-frequently used alphabet). This has the advantage since it will be generally much easier to learn and type two-keystroke characters than three-keystroke characters. In yet another exemplary embodiment of the present invention, twelve keys arranged in a 4 by 3 array are used to encode all printable ASCII symbols (e.g., excluding the upper-case alphabets), while no more than three keystrokes need to be used to represent a character. In another embodiment, all ASCII characters including the upper-case alphabets are encoded/represented using the twelve keys.

These aforementioned exemplary embodiments may be modified so that more than one set of characters can be encoded separately (e.g., each set mapped separately using Huffman coding, etc.). For example, numbers and alphabets can be separately encoded/mapped. This can be done in at least one of the following two ways: (1) If we assume that numbers and alphabets will be input in different modes (e.g., switchable using an additional button/key on the keyboard, etc.), they can be independently "encoded" so that characters from these two sets may possibly be mapped to the same key sequences. (2) We can encode one set first and then encode the other set so that the same keystroke sequence is mapped to no more than one character. In this case, the second set will typically be mapped to longer key sequences (e.g., based on implementation).

Since certain keyboard embodiments of the present invention use one or more sequential keystrokes to represent a single character, the operations at the levels of keys and characters are potentially distinct unlike in the case of other conventional keyboards. For example, characters can be deleted on a key basis or a character basis. Likewise, undo operations of typing can be implemented at these two distinct levels. In certain embodiments of the present invention, a keystroke is considered an "atomic" operation, whereas in certain other embodiments, a character input (e.g., a sequence of valid keystrokes) is considered an atomic operation. In some cases, both of these two different levels of granularity are used depending on the application or the context. Another ramification of using keystroke sequences to represent a character according to a certain embodiment of the present invention is that, in some designs of this type of keyboard, there may be key sequences that do not map to any valid character. When a user types a key sequence that has no corresponding character, an error handling routine is invoked in some embodiments of the present invention. In one embodiment, an error message is displayed and the user is given a chance to correct the error. In another embodiment, all keystrokes since the last known (valid) character boundary is automatically deleted, possibly with warning message or beep, etc. In yet another embodiment, only the last keystroke is deleted (e.g., with optional warning, and/or with a list of valid keys that would not result in an invalid character, etc.). In yet another embodiment of the present invention, all keystrokes up to the point of error is simply ignored, possibly with warning, and it accepts the next keystroke(s). A special character or (visual) marker indicating an error may be included in place of the incorrect keystrokes (e.g., those not corresponding to valid characters, etc.) in certain applications so that they can be corrected later. This type of implementation can be useful for touch typists who tend to type fast (e.g., often without looking at the display screen, etc.). According to a certain embodiment of the present invention, a special input (e.g., a re-synchronization symbol/marker) is used (e.g., by a user, etc.)

such that when it is invoked all immediately preceding keystrokes, if any, that do not correspond to a character are ignored and the subsequent keystrokes are used to generate a new character signal (or, simply character, for short).

According to at least one embodiment of the present invention, a method and system for labeling characters on a keyboard (e.g., comprising multiple keys) is provided. In some embodiments, each character is marked on all keys that constitute the character, with appropriate labels (e.g., on keytops, etc.) indicating the keystroke ordering. In some other embodiments, an auxiliary display is used, for example, to indicate possible keystroke completions when one or more keystrokes have been generated. In certain embodiments, LCD or LED based keys (or, keytops) are used for this purpose. According an embodiment of the present invention, a sequential keystroke keypad is used as a part of a mobile device (e.g., disposed on a surface of the device's housing, etc.) such as a cellular phone or a personal digital assistant (PDA). In a certain embodiment, a sequential keystroke keypad is disposed on top of a pointing device (e.g., a mouse, etc.) for a data processing system (e.g., a personal computer). Certain aspects of the present invention may also be applicable to "soft keyboards" or on-screen or virtual keyboards (e.g., software-based keyboard displayed on a graphical user interface, etc.), which may be operated by a pointer, a stylus, or a finger (e.g., in the case of a touchpad), etc.

Therefore, as summarized herein, the present invention provides, among other things, a method for efficiently configuring a keyboard (or, a keyboard layout) comprising a plurality of keys, where a sequence of one or more keystrokes represents a character. These and other embodiments, features, aspects, and advantages of the present invention will be apparent from the accompanying drawings and from the detailed description and appended claims which follow.

BRIEF DESCRIPTION OF THE DRAWINGS

The novel features of the present invention are set forth in the appended claims. The invention itself, however, as well as preferred modes of use, and advantages thereof, will best be understood by reference to the following detailed description of illustrative embodiments when read in conjunction with the accompanying drawings, wherein:

FIGS. 1A through 1D show exemplary Morse code sequences consisting of one dot and two dashes. The Morse code in FIG. 1A represents an alphabet 'w' in the standard international/English Morse code, whereas FIGS. 1B through 1D represent sequences {a,t}, {e,m}, and {e,t,t}, respectively.

FIG. 7B is a table showing an exemplary character and key sequence mapping according to one embodiment of the present invention for the keypad of FIG. 7A. An exemplary frequency of occurrence table for alphabets from a particular language/lexical domain, ignoring cases, has been used to derive this keypad layout.

FIG. 8B is a table showing an exemplary character and key sequence mapping in one embodiment of the present invention using the ten select keys from the keypad of FIG. 8A. The frequencies of occurrence of English alphabets from a particular domain (e.g., ignoring cases) have been used to derive this exemplary keyboard layout.

FIG. 9B depicts a table for a character and key sequence mapping in a certain embodiment of the present invention using the exemplary keypad of FIG. 9A. The frequencies of occurrence of alphabets and of a few widely used punctuation symbols from a particular context or domain have been used in this exemplary embodiment.

FIG. 10 illustrate undo or delete operations according to an embodiment of the present invention. This example is uses the exemplary character vs. keystroke sequence mapping shown in FIG. 7. The key sequence "364683223 823" and the corresponding character string are shown in FIG. 10A. FIG. 10B shows an undo or delete operation performed at the keystroke level, whereas FIG. 10C shows an operation performed at the character level.

FIG. 14A shows a snapshot of keypad labels, in accordance with the exemplary embodiments of FIG. 8, before any key has been actuated. The relative position of each label on keys '1' and '2' represents the postfix key to generate the corresponding character. FIG. 14B shows another snapshot when the '1' key has been pressed.

FIG. 15 shows an example of an error due to an invalid sequence of keystrokes. The example, based on the embodiment of FIG. 7, shows the key sequence "337" for the character "z" instead of the correct "336".

DETAILED DESCRIPTION

The present invention will now be described more fully hereinafter with reference to the accompanying drawings, in which preferred and some alternative embodiments of the invention are shown. It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. Like numerals refer to like parts throughout.

The present invention teaches, among other things, how to design or configure an efficient and/or optimal sequential keystroke keyboard based on prefix-free encoding, which is typically used in communications and, in particular, for purposes of data compression. The idea is that we view the character-keystroke mapping as an encoding of characters using the available keys. Then (a part of) the keyboard design/configuration becomes the problem of finding an (optimal) "encoding" scheme for each character from a given character set with the given set of available keys. In some embodiments of the present invention, a user inputs character data from a predefined set of characters on an input device with a limited number of keys by pressing (or, pressing/releasing, etc.) one or more keys, in a sequential fashion, for each character. For sequential stroke keyboards, a unique signal corresponding to each valid sequence of keys can be generated from a device itself. Many keyboards which are not specifically designed for sequential keystroke operations, however, can also be used as this type of keyboards. For example, keystroke sequences may be parsed by the data processing system to which the keyboards are coupled, etc. Most keyboards or keyboard devices generate both key press and key release signals. The time interval between the key press and key release events comprises the duration when the key is in a pressed state. In the simplest case, for example, where one key is pressed and released after another has been pressed and released, the key sequence can be easily identified.

Figure 2A:
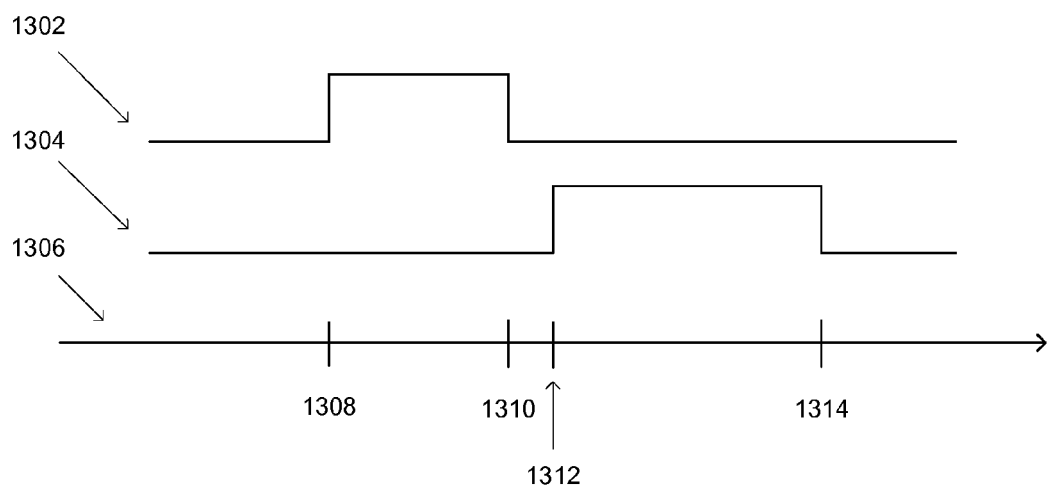
FIGS. 2A, 2B, 2C, and 2D illustrate exemplary key sequence parsing methods based on the key press and key release events. The horizontal arrow in each figure represents a time axis in an arbitrary scale. The rising and falling steps of the lines correspond to the key press and key release events, respectively. The keystroke example of each figure is explained in detail later in the detailed description section.
Figure 2B:
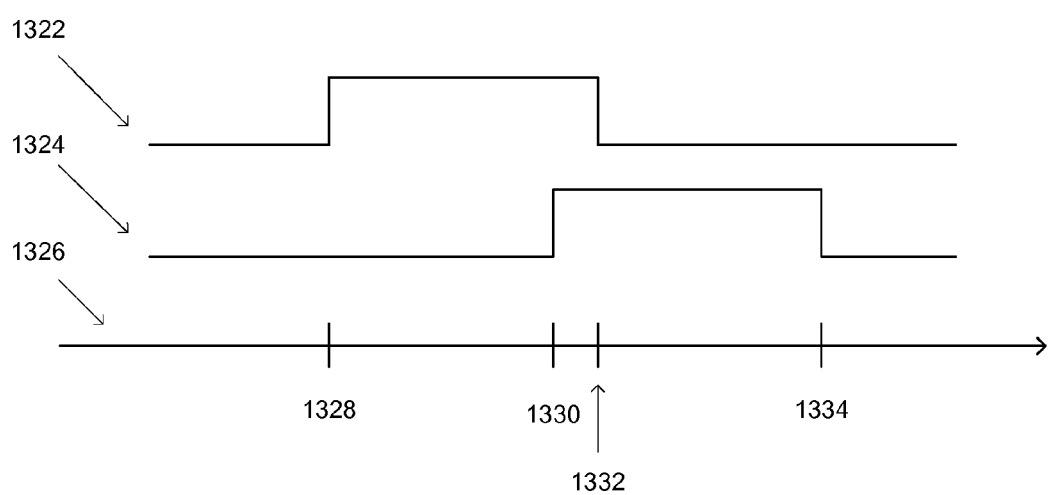
Figure 2C:
Figure 2D:

This is illustrated in FIG. 2A in accordance with an embodiment of the present invention. Two keystrokes, 1302 and 1304, are drawn against a time axis 1306 drawn in an arbitrary scale. The rising and falling steps correspond to the key press and key release events, respectively. The first key is pressed at time 1308 and released at time 1310, and the second key is pressed and released at times 1312 and 1314. In this case, it is easy to see which key has been activated first. In another example shown in FIG. 2B, where two keystrokes 1322 and 1324 are shown against the time axis 1326, the second key is pressed at 1330 before the first key has been released at 1332. In this case, even though there is (short) overlap between two keystrokes, one ranging from 1328 to 1332 and the other ranging from 1330 to 1334, it is not difficult to pick the correct order of keystrokes. However, in some cases, ambiguities can arise, especially when the user uses more than one fingers or thumbs to operate keys. FIGS. 2C and 2D show a couple of such examples. In FIG. 2C, two keystrokes, 1342 and 1344, are shown against the time axis 1346. In this example, the first key has been pressed at 1348 and released at 1354, and while the first key is in the pressed state, the second key is pressed, 1350, and released, 1352. A similar situation is shown in FIG. 2D with the time axis 1366. In this example, the key 1362 is pressed at 1368 and released at 1374 and the key 1364 is pressed at 1370 and released at 1372. As in FIG. 2C, the second keystroke 1364 is "enclosed" by the first keystroke 1362.

There are many different ways or rules by which keystroke sequence or order can be determined (which, for example, may be used when one of the aforementioned ambiguities arises, etc.): (1) We can simply ignore all or some of the overlapping keystrokes as errors (e.g., ignoring 1344 or both 1342 and 1344 in FIG. 2C). (2) Order keystrokes based on the times of the key press events. (3) Order keystrokes based on their times of release. (4) Or, order keystrokes based on the middle points of the key pressed states. According to the rule (2), both keystrokes 1342 and 1362 occur first in FIG. 2C and in FIG. 2D, respectively. On the other hand, according to the rule (3), later initiated keystrokes 1344 and 1364 occur first in FIG. 2C and in FIG. 2D, respectively. The rule (4) gives keystroke 1342 as the first one in FIG. 2C whereas keystroke 1364 as the first one in FIG. 2D. Note that actual time of key activation can be either the time of press or the time of release, or some time in between, depending on the application. This idea can be easily generalized to the cases where more than two keystrokes are involved, as will be clear to people of skill in the art, based on the present disclosure of exemplary embodiments. The term keystroke will be used herein to indicate any application-specific definition of events of key presses or key releases or certain combinations thereof, as illustrated earlier. In certain embodiments, keystrokes are parsed by a keyboard, or they can be generated/parsed by other processing units coupled to the keyboard based on the events/signals generated from the keyboard. Likewise, the character signal generation may be implemented in a "key-board" or in other data processing unit. In some cases, the keyboard and the data processing or communications module may be housed in one unit, such as in the case of handheld device with built in keypad.

Once the definition of keystrokes is determined and a certain keystroke sequence is received, an appropriate character or characters can be generated according to a predefined mapping, for example, based on a prefix-free encoding, in various embodiments of the present invention. This will be further elaborated later, in particular, with respect to FIG. 5. A prefix-free code is a (variable-length) code constructed so that dividing a code word (e.g., a sequence of symbols) into two pieces (e.g., a first subsequence of non-zero length and a second subsequence of non-zero length) cannot result in the first part (e.g., the first subsequence of symbols) being a code word. This property permits the proper framing of transmitted code words when (a) external synchronization is provided to identify the start of the first code word in a sequence of code words and (b) no uncorrected errors occur in the symbol stream. Prefix-free coding is used, for example, for international country calling codes, VCR+, ISBNs, and the Secondary Synchronization Codes used in the UMTS W-CDMA 3G Wireless Standard, etc. In a certain embodiment of the present invention, a particular prefix-free encoding scheme, known as Huffman coding, is used based on the frequency of occurrence of each character (e.g., in a specific language context or domain, etc.), or based on other (normalized) weight values (e.g., based on the frequency of occurrence of each character or based on other considerations such as location of each character in a particular layout of a keyboard, etc.) to generate substantially optimal key sequences for a given character set (e.g., letters, numbers, symbols, control characters, etc.). Huffman code is known to be optimal under certain conditions. A variety of other coding schemes have been devised, some of which are proven to be optimal under various conditions and constraints. The present invention enables the user to efficiently input a typical data from a given probability distribution using a limited number of keys. In certain embodiments, a sequential keyboard may be operated by a user's single hand or even by a single finger or thumb (or, using a few fingers/thumbs).

Figures 3A, 3B:
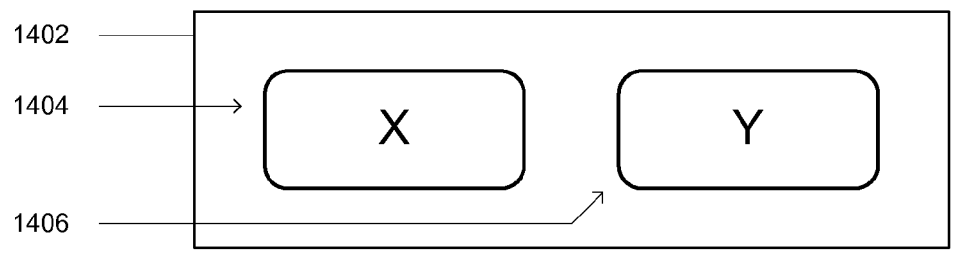
FIG. 3A depicts an exemplary keypad with two keys. This "toy" keypad is used to illustrate a keyboard design scheme according to certain embodiments of the present invention.
FIG. 3B shows a hypothetical frequency/probability chart of decimal numbers. This table is used along with the keypad shown in FIG. 3A to illustrate a keyboard design scheme in certain embodiments of the present invention.

According to an embodiment of the present invention, the design process of the keystroke sequence mapping starts by identifying a set of keys (for example, 12 binary keys, etc.) and a set of characters to be "encoded" by the given set of keys. Then the frequency of occurrence of each character needs to be obtained for the specific language domain/context where the embodiment is going to be used. This can be done by collecting a certain amount of "writing samples" from the given domain of uses, and counting the occurrence of each character. In some embodiments, certain weight factors are used (e.g., multiplied, etc.) on top of this frequency distribution (e.g., derived from data). Then Huffman coding is used to map key sequences to characters. An exemplary process is illustrated in FIG. 3 using a "toy" keypad shown in FIG. 3A. The example keypad 1402 consists of two keys, "X" 1404 and "Y" 1406, which will be used to encode ten decimal numbers, 0 through 9. FIG. 3B shows a hypothetical frequency chart 1408 of ten decimal numbers. In certain embodiments of the present invention, the outcome of character encoding scheme may strongly depend on this probability distribution. Note that, in this (hypothetical) example, the distribution is more or less flat, ranging from 13.1% for "0" to 6.9% for "9".

Figure 3C:
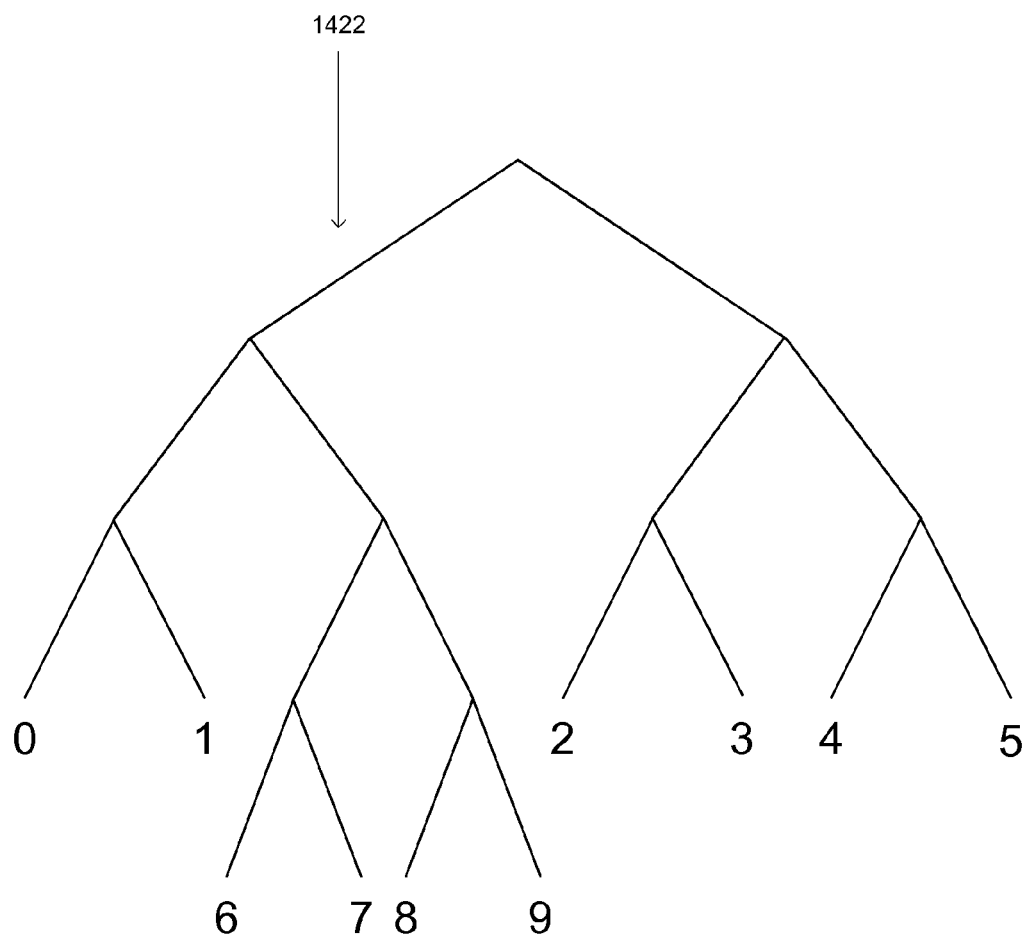
FIG. 3C shows a binary tree representing the Huffman coding example based on the character frequency/weight table of FIG. 3B. Note that this illustrates but one of many possible arrangements of binary trees compatible with Huffman coding. From this tree, one can "read" the key sequence mapped to the character corresponding to each node.
Figures 3D, 3E:
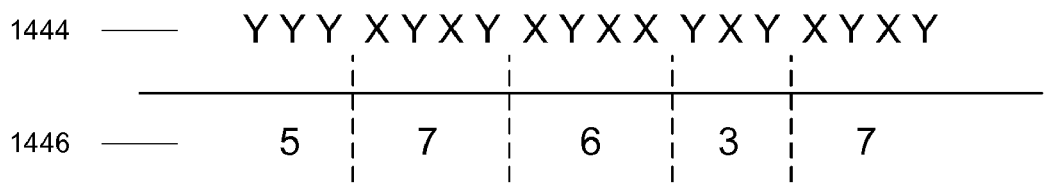
FIG. 3D is the resulting key sequence diagram for the two-key keypad of FIG. 3A, based on the frequency of occurrence table of FIG. 3B. These key sequences are "read" from the binary tree shown in FIG. 3C, by associating left branches with the character X and right branches with Y.
FIG. 3E illustrates an exemplary key sequence and the corresponding character sequence, based on the example of FIGS. 3A-3D. It should be noted that this mapping is unique. That is, reading from the first key, Y, the sequence "57637" is the only valid character string that is compatible with the given key sequence, and vice versa.

Huffman coding can be implemented in many different ways as is well known in the pertinent art. If we use an algorithm where trees are built from bottom up, the resulting final tree 1422 shown in FIG. 3C is obtained. Again, this outcome is specific to the frequency/weight table 1408 that we have used. Note also that it is one of many possible arrangements of binary trees compatible with Huffman coding. There are 10 leaf nodes in the tree 1422, and each node is labeled with one of the decimal numbers. If we assign "X" for left branching and "Y" for right branching, then, from this tree, the key sequence mapped to the character corresponding to each node can be "read" following each path from the root leading to each leaf node. FIG. 3D illustrates the mapping 1442 between the sequence of keystrokes and its corresponding character based on the tree of FIG. 3C. It should be noted that this mapping is unique in the sense that, given a valid sequence of keystrokes, there is only one character sequence that is compatible under the chosen mapping. One exemplary key sequence is shown in FIG. 3E. The sequence of X's and Y's shown on the top row, 1444, can be parsed as a sequence of numbers, "57637", displayed at the bottom, 1446. It should be noted that X and Y could be interchanged to derive a different mapping. In general, there are N! ways of different mapping (e.g., compatible with a given frequency table) for a keyboard having N keys (or, for a set of N keys). More general Huffman coding schemes such as assigning different cost for each key, or assigning a cost proportional to the length of a keystroke sequence, etc., may also be used in certain embodiments. In some cases, additional constraints such as limiting the maximum length of a keystroke sequence below a certain predetermined number may also be included while implementing Huffman algorithm or other (variable-length) prefix-free coding schemes.

Figure 4A:
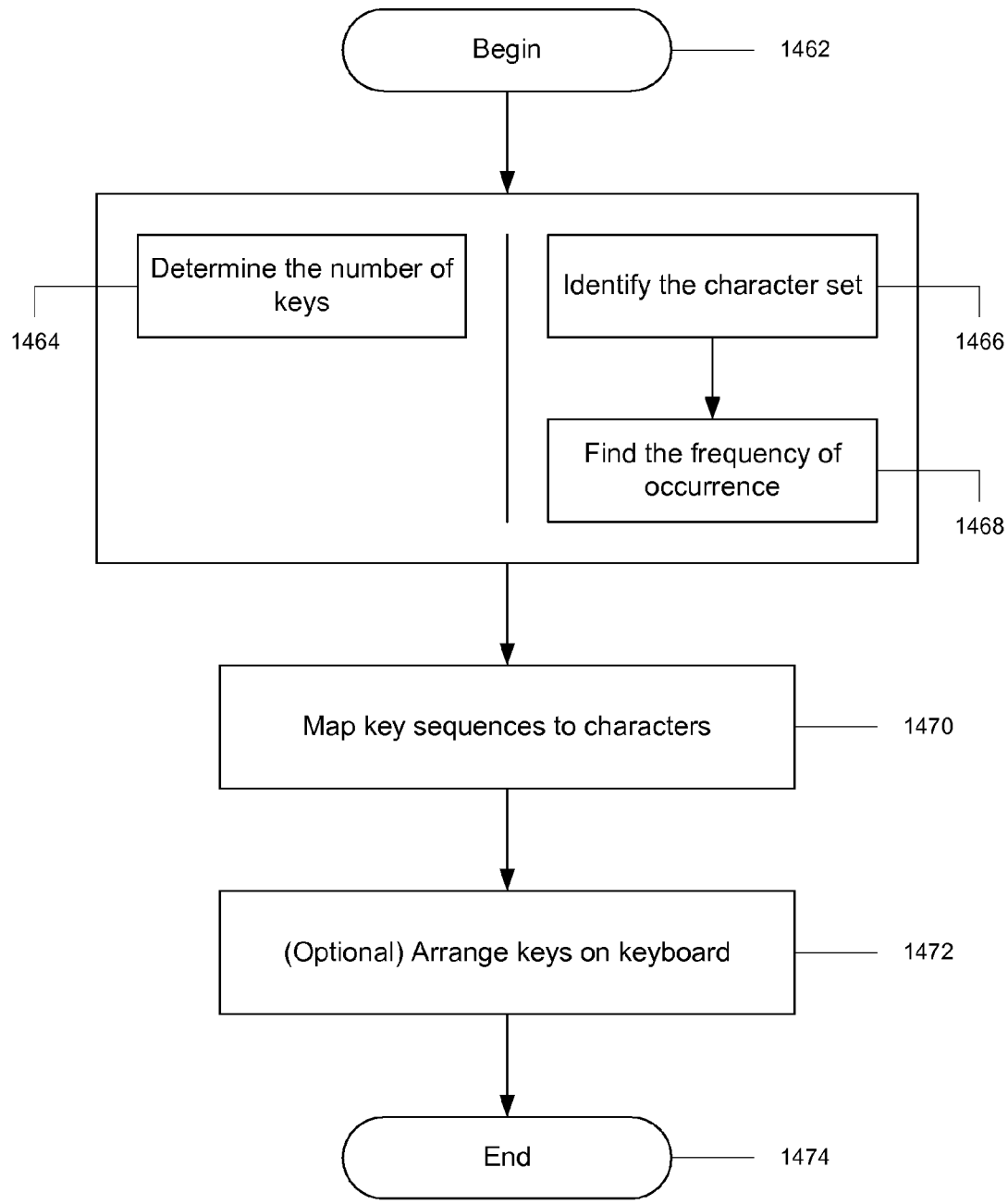
FIG. 4A illustrates an exemplary design process for mapping key sequences to a set of characters using prefix-free encoding, according to an embodiment of the present invention. The operations shown in a big box (right below the beginning block) can be performed in any order. In some embodiments, variations of Huffman coding are used when mapping key sequences to characters.

FIG. 4 summarize various exemplary operations for sequential-keystroke keyboard design/configuration according to certain embodiments of the present invention. The flow chart shown in FIG. 4A illustrates an exemplary process for designing key sequences corresponding to a set of characters using a prefix-free encoding. The operations shown in a big box, 1464 and 1466/1468 may be performed in any order in a certain embodiment. The exemplary process starts from block 1462 and proceeds as follows:

Block 1464: First, a keyboard with a preset number of keys is defined. In some embodiments, keys are assumed be binary, and we further assume that all keys are equivalent in terms of cost of typing. This is to simplify the computation. (For example, Huffman encoding, which is a polynomial time algorithm, may be used only for the key set with a constant cost for each key.) The consequence of this assumption is that the final design will have permutation symmetry of all keys, as stated earlier. That is, rearranging keys in the keyboard will generate an equivalent keyboard design (e.g., in terms of the average number of keystrokes for each character). In some embodiments, the keys may be ordered (e.g., without attributing different costs for the keys, etc.), which may be used, in a subsequent operation, to arrange keys on the keyboard.

Block 1466: A set of characters to be represented (e.g., to be generated by the keyboard, etc.) is identified. This character set is typically domain specific. For general-purpose keyboards for the English language, a set of all printable ASCII characters may be used. For other purposes, some characters may not be needed at all. For example, many punctuation symbols may not need to be included when designing, for example, a remote controller for VCRs or television sets.

Block 1468: Frequencies (or, probabilities) of occurrence of each character in the given character set is computed, or otherwise obtained. The frequency/probability table can be obtained, in a certain embodiment, by collecting enough "writing samples" from the given domain of uses (e.g., a lexical domain) and by counting occurrences of each character, e.g., using a computer program (and then, optionally, normalizing them, etc.). For example, for designing a keyboard to be exclusively used for SMS (short message service) or text messaging, sample SMS messages can be collected (e.g., from the message archive, etc.). For general purpose keyboard design, newspaper archives (such as the New York Times, etc.) might be used.

Block 1470: Once this probability distribution is obtained, a prefix-free encoding is used to map key sequences to specific characters. In some embodiments of the present invention, variations of Huffman coding are used for their simplicity and efficiency. In the simplest case, the mapping can be found manually by building k-ary trees, where k is the number of keys to be used. In more complex cases, a brute-force exhaustive search can be used as long as the number of keys and the number of characters to be encoded/represented are reasonably small (which may be the case in many keyboard designs). Note that, under the assumption of the constant cost for each key, there are typically multiple solutions that have the same efficiency (e.g., in terms of the average number of keystrokes per character). This freedom/option can be used to select a particular mapping (e.g., a particular arrangement of keys on a keypad) which is easy to learn and easy to remember in a certain embodiment.

Block 1472: This operation may be optional in some embodiments. As mentioned earlier, there may be permutation symmetry with regards to key arrangement in certain embodiments. Therefore we can re-arrange (or, re-label, etc.) keys in a keyboard without losing the efficiency of the solutions found through a prefix-free encoding method. This operation can be used, for example, to make the keystroke sequences and their mappings easy to learn and easy to remember. In some embodiments, the order of keys arranged on a keypad (e.g., from top to bottom and from left and right, etc.) is directly used in Huffman coding. In such a case, the keys earlier in this order will be more frequently used.

The exemplary process of FIG. 4A then terminates at block 1474. Keyboards designed in this way will be optimal or near-optimal (e.g., depending on the particular algorithm or "encoding scheme" used, etc.) in the sense that it takes the least amount of time on average, or nearly so, to type a typical sentence or paragraph from the given domain of usage. This system is especially useful when the number of keys are much smaller than that of the characters to be encoded/represented, which is typically the case for small devices such as mobile phones or handheld devices, etc.

Figure 1A:
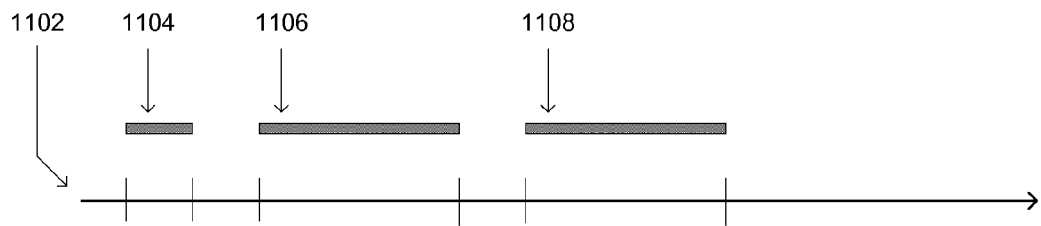
Figure 1B:
Figure 1C:
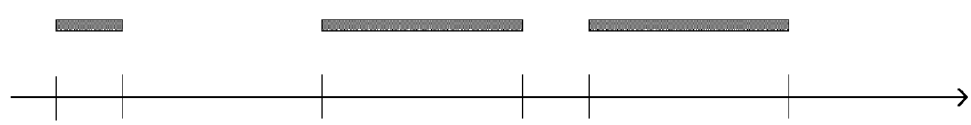
Figure 1D:
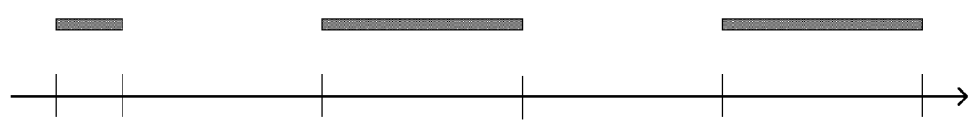
Figure 1E:
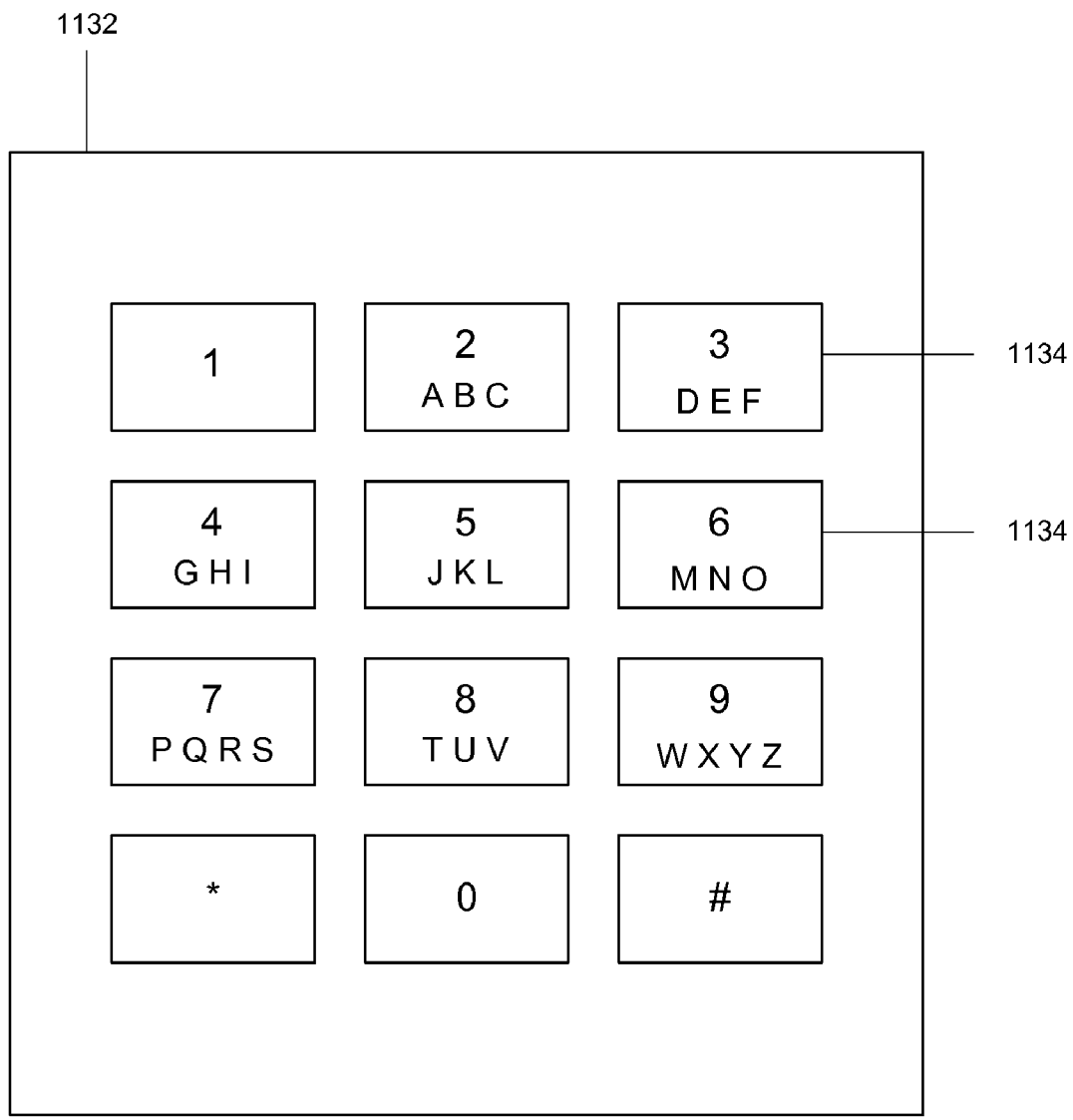
FIG. 1E depicts a typical keypad used in a telephone handset, where 12 keys are arranged in a 4 row by 3 column matrix. The keys '2' through '9' are used typically for English alphabets (e.g., using the multi-tap scheme), as illustrated in the figure.
Figure 4B:
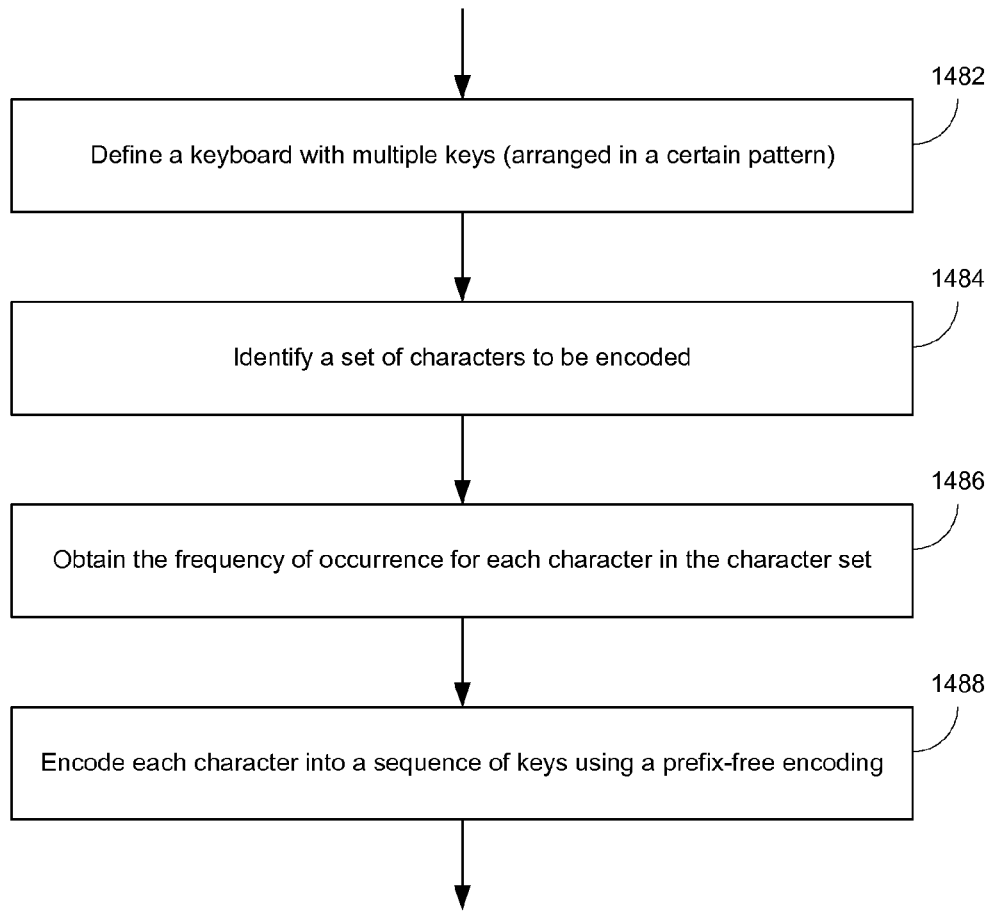
FIG. 4B illustrates, as a flow chart, another exemplary process for configuring a keyboard for a sequential keystroke mode (or, for designing a sequential keystroke keyboard), according to at least one embodiment of the present invention.

Another flow chart is shown in FIG. 4B illustrating an exemplary process for configuring a keyboard for a sequential keystroke mode (or, for designing a sequential keystroke keyboard) according to another embodiment of the present invention. The exemplary process begins by first defining a keyboard with multiple keys (e.g., arranged in a certain order or pattern such as a rectangular array, etc.), at block 1482, and identifying a set of characters to be represented, at block 1484. Next, the frequency of occurrence table for the characters in the character set is computed or otherwise obtained, at 1486, for a chosen linguistic or lexical domain. Then, at 1488, each character is "encoded" into a sequence of keystrokes using a prefix-free encoding such as Huffman coding, based on the frequency/probability table. As stated earlier, the keys may be arranged in a particular pattern based on the order of keys initially set. In a certain embodiment, keys are arranged in a rectangular array (e.g., with a predetermined number of rows and columns, etc.) from the upper left corner to the lower right corner. (For example, 1, 2, 4, 3, 5, 7, 6, 8, *, 9, 0, and # in the exemplary 12-digit keypad of FIG. 1E.) Other arrangements/orderings may also be used. In some embodiments, a key arrangement (e.g., within the permutation symmetry constraint, if any) may be made configurable, for example, by using a graphical user interface panel for the keyboard device driver, or application programs, etc.

Figure 5:
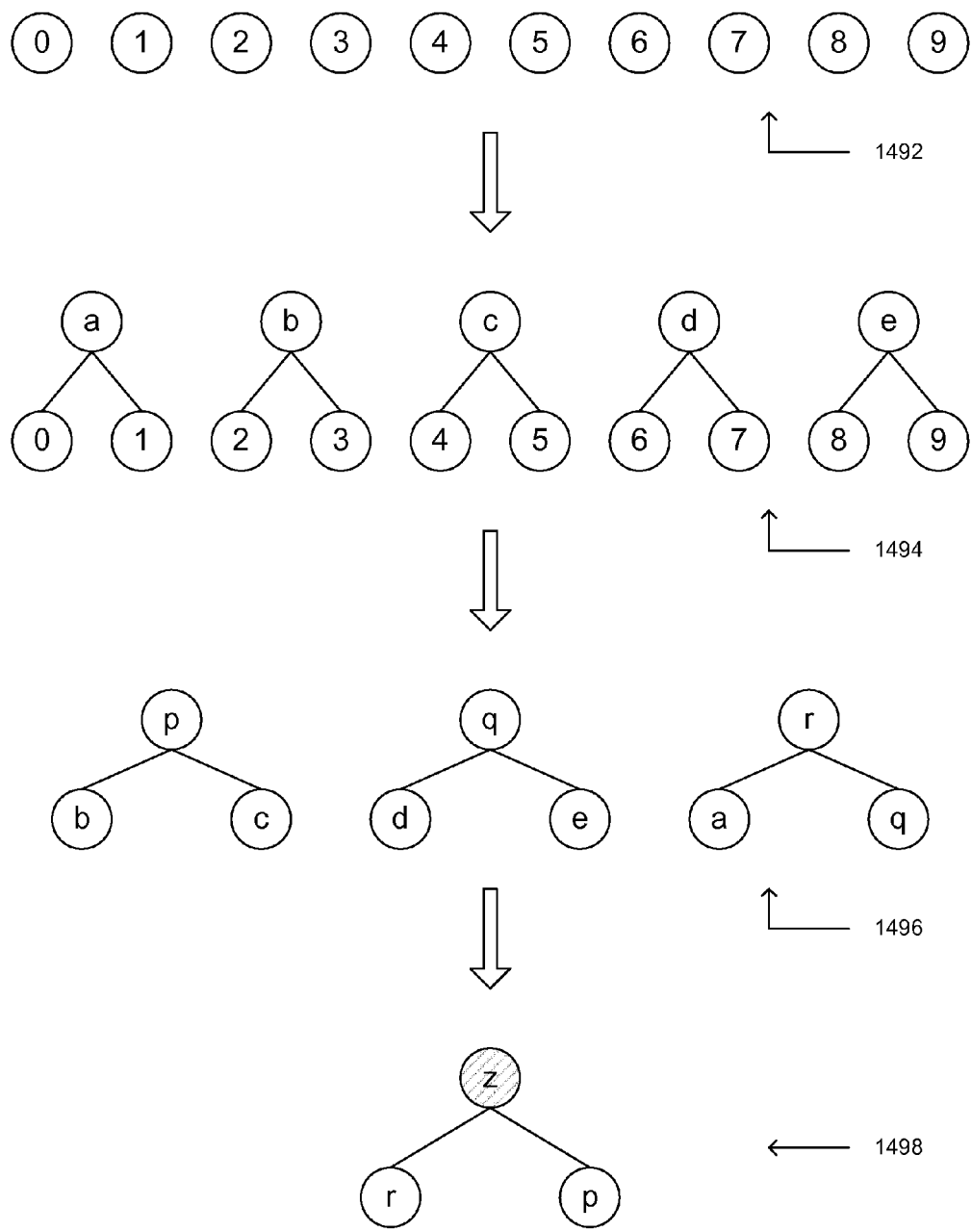
FIG. 5 illustrates, according to an embodiment of the present invention, an exemplary process of applying Huffman coding to a set of characters using a given set of keys. This illustration is based on the example of FIG. 3. Various binary trees shown in the figure represent intermediate steps while applying the algorithm. The trees on the top row consist of single nodes corresponding to the individual characters. The tree on the last row, which is the outcomes of this algorithm, represents effectively the same tree shown in FIG. 3C, from which the key sequences can be read.

With respect to FIG. 5, an exemplary process of applying Huffman algorithm to a set of characters is shown. This exercise uses the example of FIG. 3 consisting of the two-key keypad, 1402, and the hypothetical frequency/probability chart, 1408. In this algorithm, ten binary trees (with single nodes) corresponding to the ten characters, 0 through 9, are built first, as shown in the row 1492. Each tree has an associated weight. In this example, the ten trees from left to right have weights proportional to the frequencies of occurrence, that is, {13.1, 12.4, 11.7, 11.0, 10.3, 9.7, 9.0, 8.3, 7.6, 6.9}. Then, starting from the trees with the smallest weights, these trees are merged two at a time, with the weights also combined. For example, the tree denoted as 'e' on the row 1494 is obtained by combining the two trees '8' and '9', with the resulting weight 14.5 (=7.6+6.9). The tree 'q' on the row 1496 is the result of merging two trees, 'd' and 'e', and its weight is 31.8. This process continues until there is only one tree remaining, which is shown on the last row 1498. Note that this tree is equivalent to the tree 1422 shown in FIG. 3C. From this tree, as before, the key sequences can be read, whose result is shown in the table 1442 of FIG. 3D.

Figure 6:
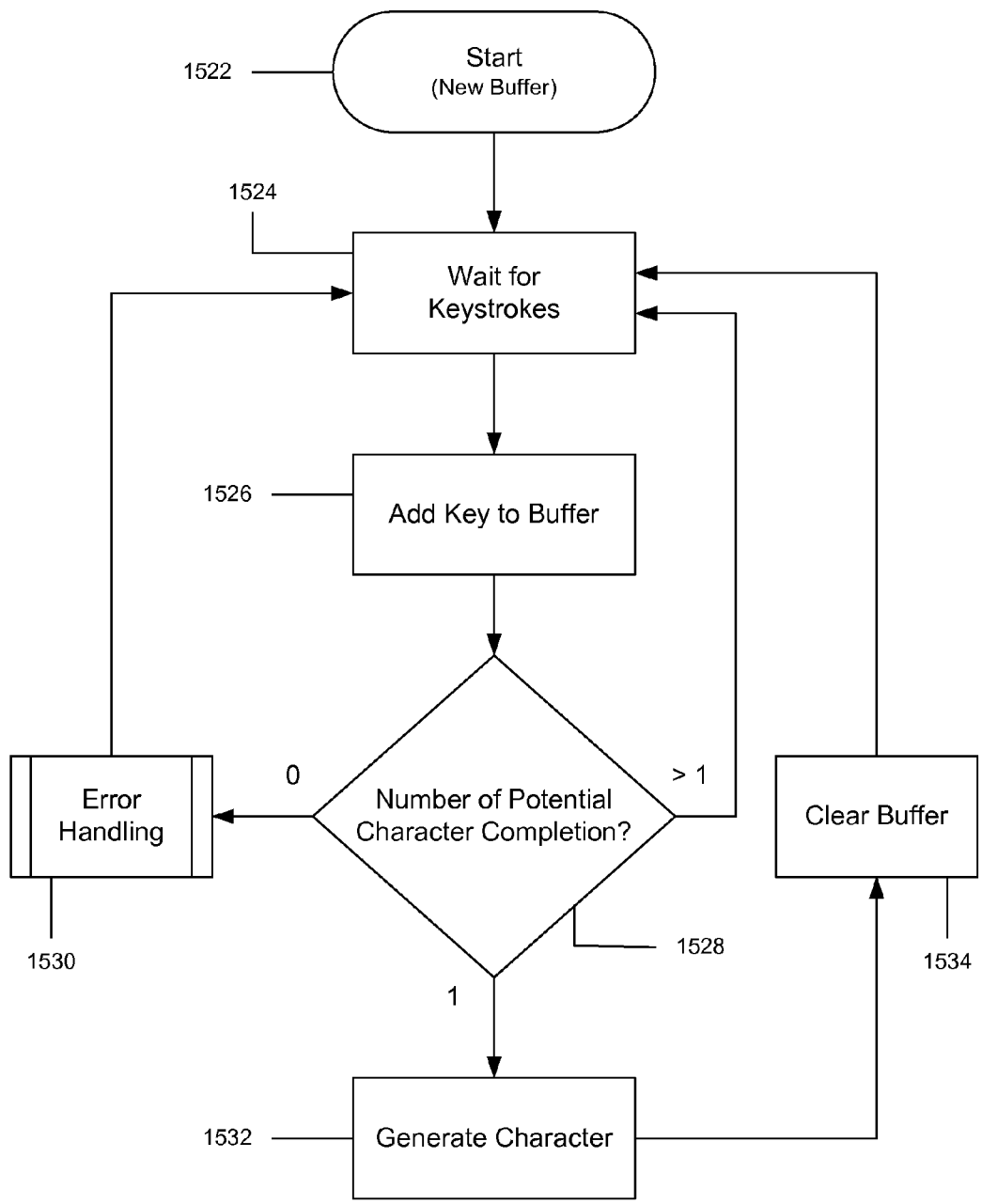
FIG. 6 is a flow chart illustrating basic operations of an exemplary key sequence parser according to an embodiment of the present invention. When a stream of keystrokes is received, the parser generates a sequence of characters based on the predefined mapping between the key sequences and characters. The figure also shows an error handling operation as a separate routine.

Turning now to FIG. 6, an exemplary embodiment of the present invention for parsing key sequences is shown. The method for parsing, as shown in the flow chart of FIG. 6, starts from 1522 by resetting a buffer or memory to store temporary keystrokes. The parser receives the keystroke stream as input, as indicated by 1524, and generates a sequence of characters as output, as shown in the box 1532. Once a new keystroke is received, 1526, it is put into a keystroke buffer, and it is tested, at 1528, whether the current key sequence in the buffer corresponds to any character based on the predefined mapping between the key sequences and characters (e.g., using a table similar to 1442 of FIG. 3D). If it does, then the corresponding character is generated, at 1532, the buffer is cleared, at 1534, and a new process starts at 1524. If not, it is checked 1528 whether there are characters that can potentially match any key sequences if an additional keystroke or keystrokes are received. If so, the control returns to the waiting state, 1524. If not, an error handling routine is invoked, as indicated in block 1530. After proper error handling is done, possibly including cleaning up of the buffer, the control is returned to the parser, 1524. Error handling will be further discussed later with respect to FIG. 15. In a certain embodiment, this type of parsing/character-generation algorithm may be implemented in a device driver of the keyboard which is connected to a data processing system such as a personal computer. In a certain other embodiment, characters (e.g., as opposed to keystrokes) may be generated from the keyboard.

Figure 7A:
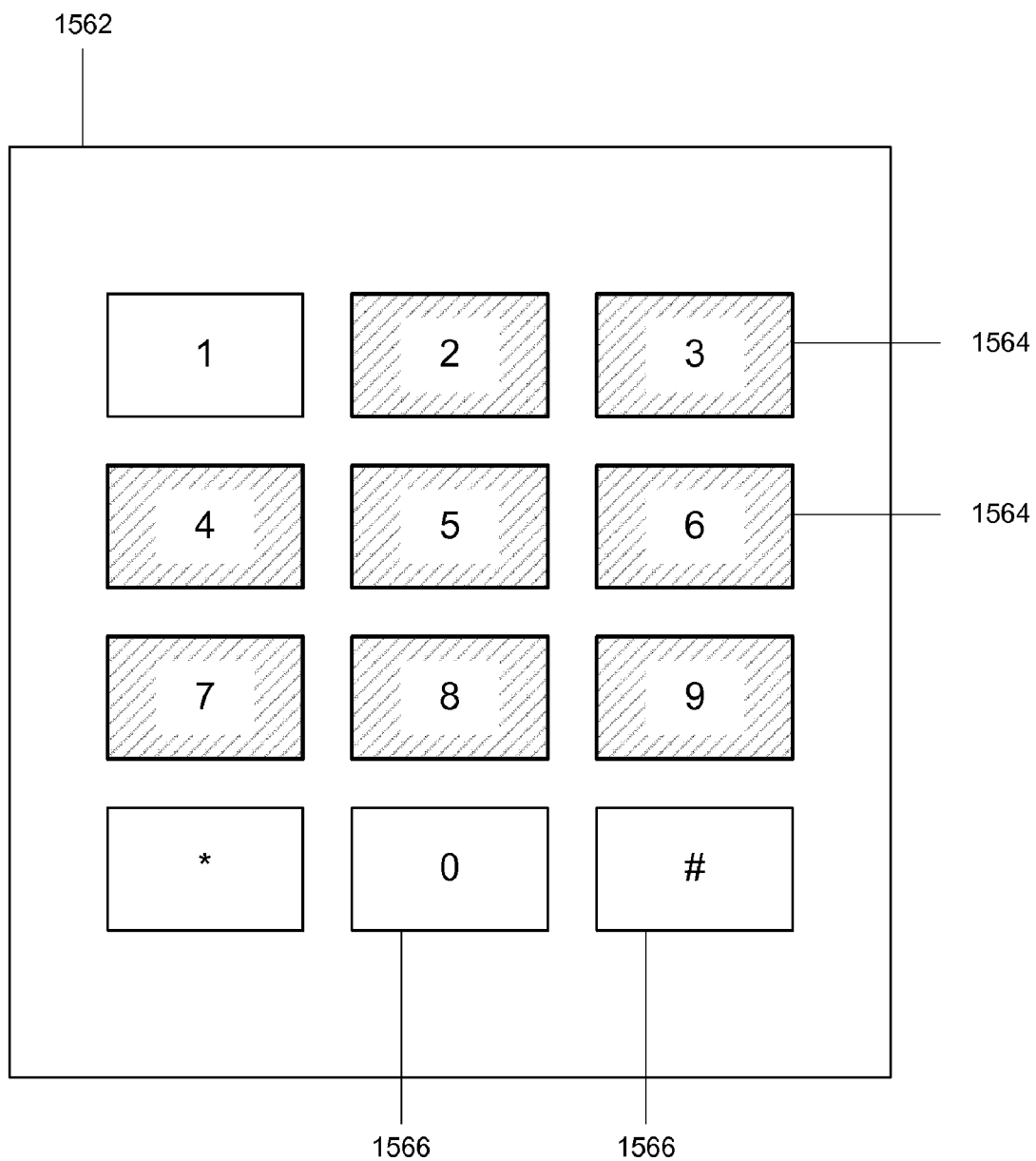
FIG. 7A shows a phone keypad. Eight keys, 2 through 9, are used to encode alphabets in certain embodiments of the present invention. These eight keys are the ones commonly used to input alphabets on phone devices. For example, Multi-Tap mode uses these eight keys. These eight keys are drawn with thicker lines (also, shaded) in the figure.

A few keyboard embodiments of the present invention are now disclosed. In one exemplary embodiment shown in FIG. 7A, eight numerical keys 1564 from a typical phone keypad 1562 are used. These eight keys are the ones commonly used to input alphabets on phone devices. For example, the Multi-Tap mode uses these eight keys. These keys are drawn with thicker lines in the figure, with shading. The other four keys 1566 are not used in this particular example. According to an embodiment of the present invention, keys are first arranged in a substantially regular pattern such as a rectangular array or grid shown in FIG. 7A. Using a process taught in this disclosure, a key sequence mapping can be obtained. One such example is shown in FIG. 7B, using frequencies of occurrence of alphabets from a particular domain, ignoring cases. (The following exemplary numbers have been used for this keyboard design: A: 7.3%, B: 0.9%, C: 3.0%, D: 4.4%, E: 12.9%, F: 2.8%, G: 1.7%, H: 3.6%, I: 7.5%, J: 0.2%, K: 0.3%, L: 3.5%, M: 2.4%, N: 7.8%, O: 7.4%, P: 2.7%, Q: 0.3%, R: 7.7%, S: 6.3%, T: 9.3%, U: 2.6%, V: 1.3%, W: 1.6%, X: 0.5%, Y: 1.9%, Z: 0.1%.) The table 1582 has two columns, one for the characters and the other for the corresponding key sequences. The labels shown in FIG. 7A are used to indicate the keys. In this embodiment, keys are pressed no more than three times to generate all lower-case English alphabets. This embodiment can be used as a part of more general encoding scheme (or, keyboard design) where some-type of context dependent mode switching is implemented. In this embodiment, for example, this particular sequential key mapping may be activated once the input mode is switched to a text mode. Also, a special prefix key may be used to input capital letters corresponding to the lower-case letters encoded by sequential keystrokes. In certain cases, postfix or modifier key(s) may be used (e.g., possibly with somewhat more elaborate keystroke parsing algorithm, etc.). A person of ordinary skill in the art will not have much difficulty in implementing this type of extensions/generalizations based on the teachings of the current disclosure.

In this particular embodiment of FIG. 7 within the particular corpus domain, the average number of keystrokes per alphabet is 1.49. That is, on average, a user will press roughly one and a half keys to input a single character. This should be contrasted with 2.18 keys when the Multi-tap mode is used. This corresponds to more than 30% decrease in typing time, even when the time for pause is ignored in the case of Multi-Tap mode. It should be noted that these numbers are for illustration purposes only. The specific numbers will be different for different domains of usage. Also, the actual typing speed may depend on how the keys are arranged on the keyboard (as well as the user's proficiency/familiarity with particular keyboards, etc.).

Figure 8A:
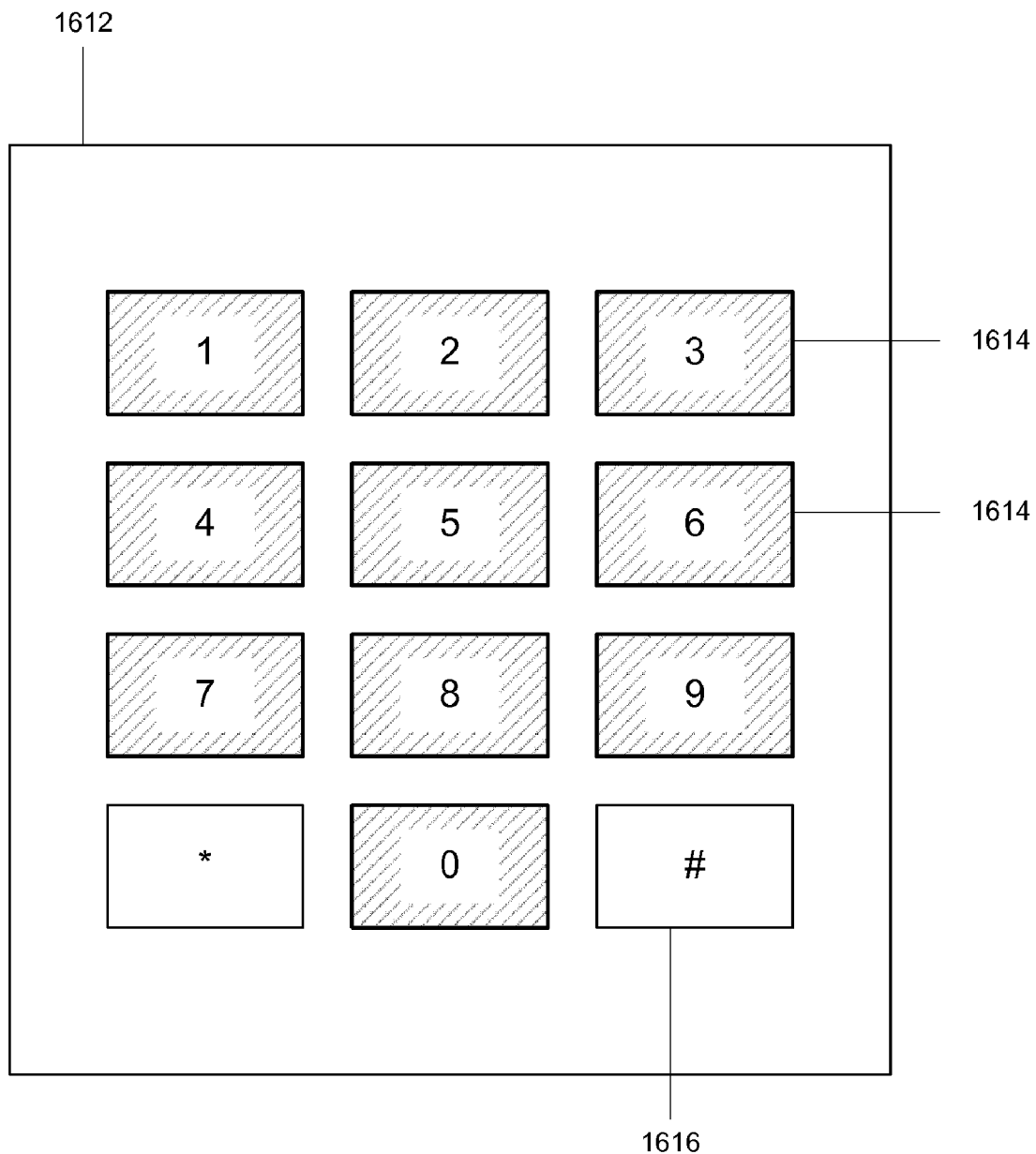
FIG. 8A shows a phone keypad. In certain embodiments of the present invention, ten numeric keys, 0 through 9, are used to encode alphabets, as illustrated in the figure. These ten keys are marked with thicker lines (also, shaded).

In another exemplary embodiment of the present invention shown in FIG. 8, ten keys from a numeric keypad 1613 of FIG. 8A, for example, corresponding to digits from 0 to 9 (e.g., keys 1614) are used to reduce the maximum number of key presses to two even for the least-frequently used alphabet, as shown in the table 1632 of FIG. 8B. This has the advantage since it will be generally much easier to learn and type two-keystroke characters than three-keystroke characters. Note that only 9 keys are used to represent 25 characters. The two keys 1616 are not used in this example. As with the example shown in FIG. 7, the English unigram frequencies/probabilities of occurrence from a particular corpus/domain, ignoring cases, has been used to derive this table 1632. In this example, the average number of keystrokes for an alphabet is 1.34, more than 10% increase in typing efficiency relative to the embodiment of FIG. 7, where only eight keys are used.

The exemplary methods of the present invention described earlier, in particular with reference to FIG. 4, can be generalized so that more than one set of characters can be encoded separately using Huffman coding. For example, numbers and alphabets can be separately encoded. This can be done in (at least) two ways. 1) If we assume that number and alphabets will be input in different modes, they can be independently encoded so that characters from these two sets may be mapped to the same key sequences. Additional keys may be needed to switch modes between these two encoding modes. 2) We can also encode one set first and then encode the other set so that there is no key sequence mapped to more than one characters. (For example, this can be easily achieved by increasing the weights of each character from one set by 100 or 1000 fold, etc.) In this case, the second set will typically be mapped to longer key sequences. This can be easily generalized to more than two separate sets of characters (e.g., three separate groups of alphabets, numbers, and symbols, etc.), as can be readily appreciated by people of ordinary skill in the relevant art, based on the teachings in this disclosure.

Figure 9A:
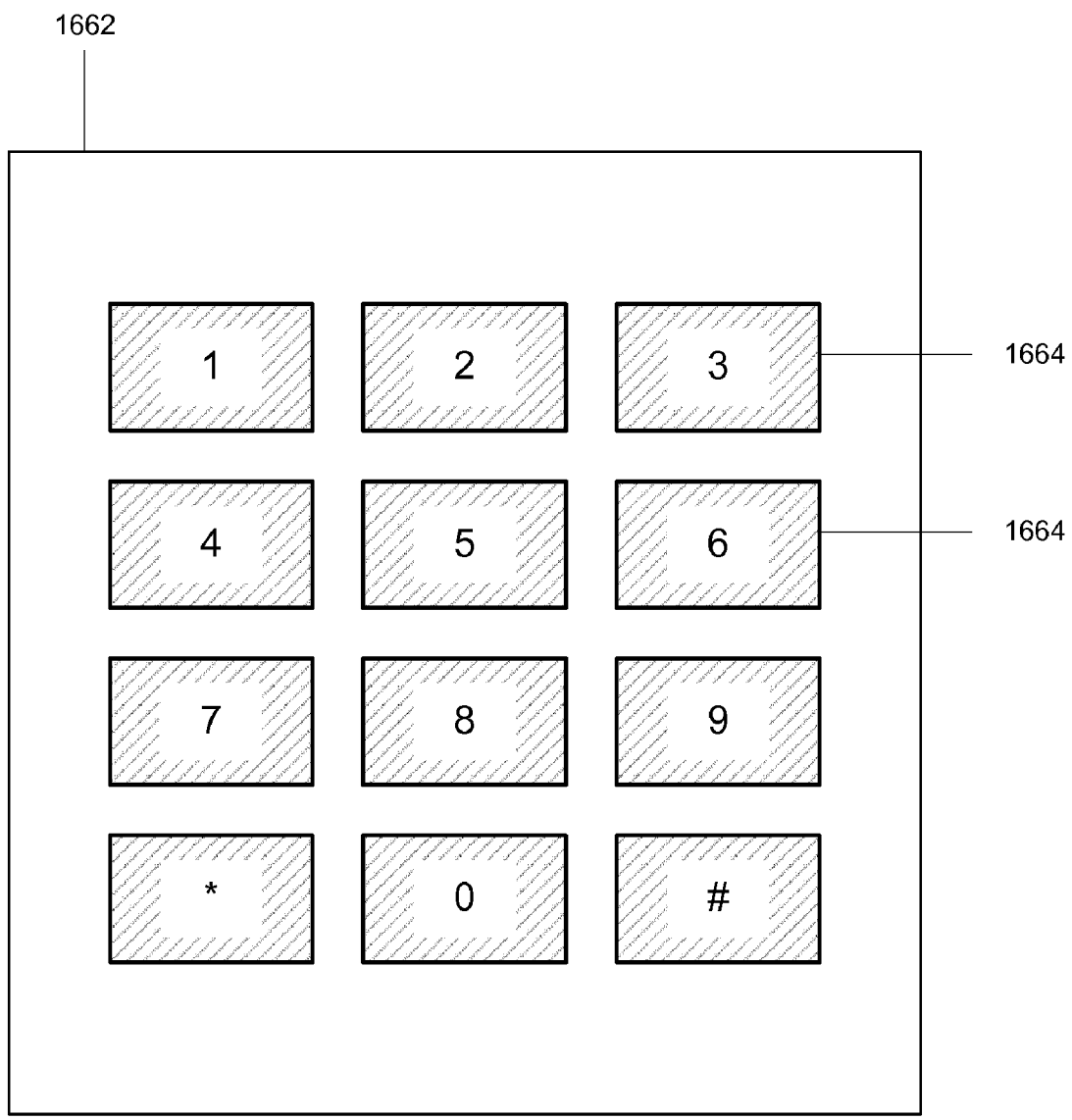
FIG. 9A shows an exemplary keypad comprising twelve keys, arranged in four-by-three array. These twelve keys are used to encode lower-case alphabets and various punctuation symbols in certain embodiments of the present invention.

An exemplary embodiment is shown in FIG. 9. FIG. 9A shows a keypad 1662 comprising twelve keys 1664, arranged in a four-by-three array. This exemplary keypad may be a part of a mobile device, which may include necessary circuitry or processing module for generating characters based on keystroke sequences. Keys on this exemplary keypad are labeled according to the typical phone keypad, as in FIGS. 7A and 8A. These keys are used to encode alphabets and a set of a few widely used punctuation symbols, as shown in the tables 1682 and 1684 of FIG. 9B. In this embodiment, two sets of characters, one for the lower-case alphabets and the other for the selected punctuation symbols, are used separately. Note that some punctuation symbols, such as the double quotation mark, may be more frequently observed than some alphabets such as Q's or Z's (e.g., in a particular lexical domain). However, in this particular embodiment, the alphabets are coded first (possibly, with shorter sequences of keys), and then the symbols are encoded. As shown in tables 1682 and 1684, the punctuation symbols have key sequences whose lengths are not shorter than any of the sequences corresponding to alphabets. Note that, as mentioned earlier, this particular embodiment is an outcome of a particular domain of usage and the frequency of occurrence of each character. Different frequency/probability tables will generally yield different coding/mapping schemes.

With reference now to FIG. 10, since certain keyboard embodiments of the present invention use one or more sequential keystrokes to represent a single character, the operations at the levels of keys and characters are potentially distinct unlike in the case of other conventional keyboards. For example, characters can be deleted on a key basis or a character basis. Likewise, undo operations of typing can be implemented at these two distinct levels. FIG. 10 illustrate this distinction. The can be viewed as either undo or delete operation depending on the context. This example is based on the simple embodiment of FIG. 7. The key sequence "364683223 823", 1712, encodes the first few words of the famous saying by Thomas Alva Edison, "Genius is 1% inspiration and 99% perspiration", as shown at the bottom row 1714 in FIG. 10A. In this example, capitalization and other symbols such as the space character are ignored. FIG. 10B shows an undo or delete operation performed at the keystroke level, where one keystroke is missing as indicated by an underscore 1716 (which may or may not be explicitly displayed on the display screen). On the other hand, FIG. 10C shows an operation performed at the character level, as indicated by two underscores, 1718 and 1720. The two-keystroke sequence, "23" corresponds to the last character, "s", of the string 1714. In certain embodiments, more elaborate algorithm is used, for example, to deal with partially input characters, etc., which will be further illustrated later.

Figure 11A:
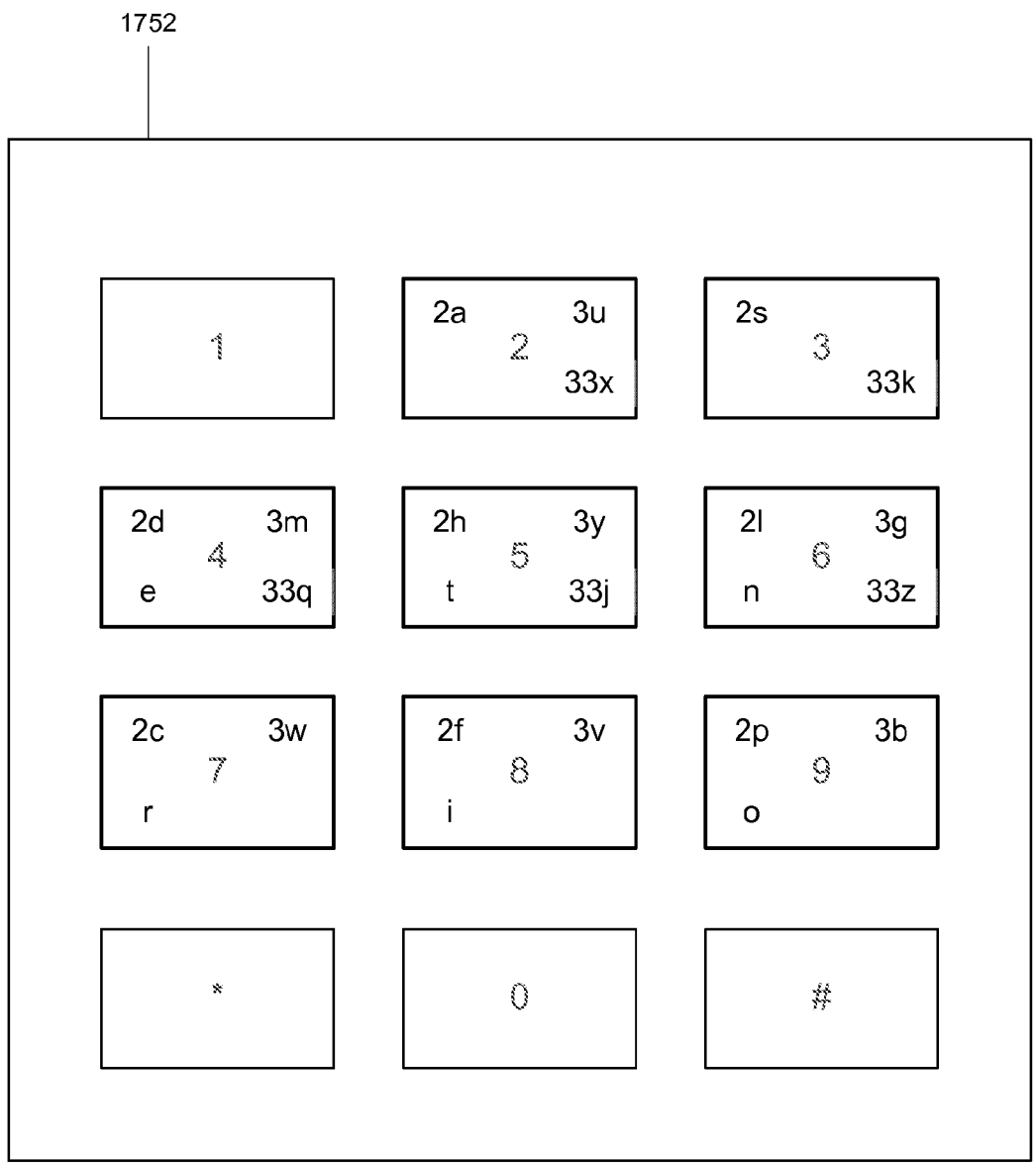
FIG. 11A shows, according to an embodiment of the present invention, an exemplary labeling for the buttons based on the embodiment shown in FIG. 7. One or more labels is associated with each key. A label with a single character indicates the corresponding key generates the character by itself. A label with a prefix (e.g., comprising one or more keys) indicates that the character in the label is generated when the key is pressed after the keys corresponding to the prefix.
Figure 11B:
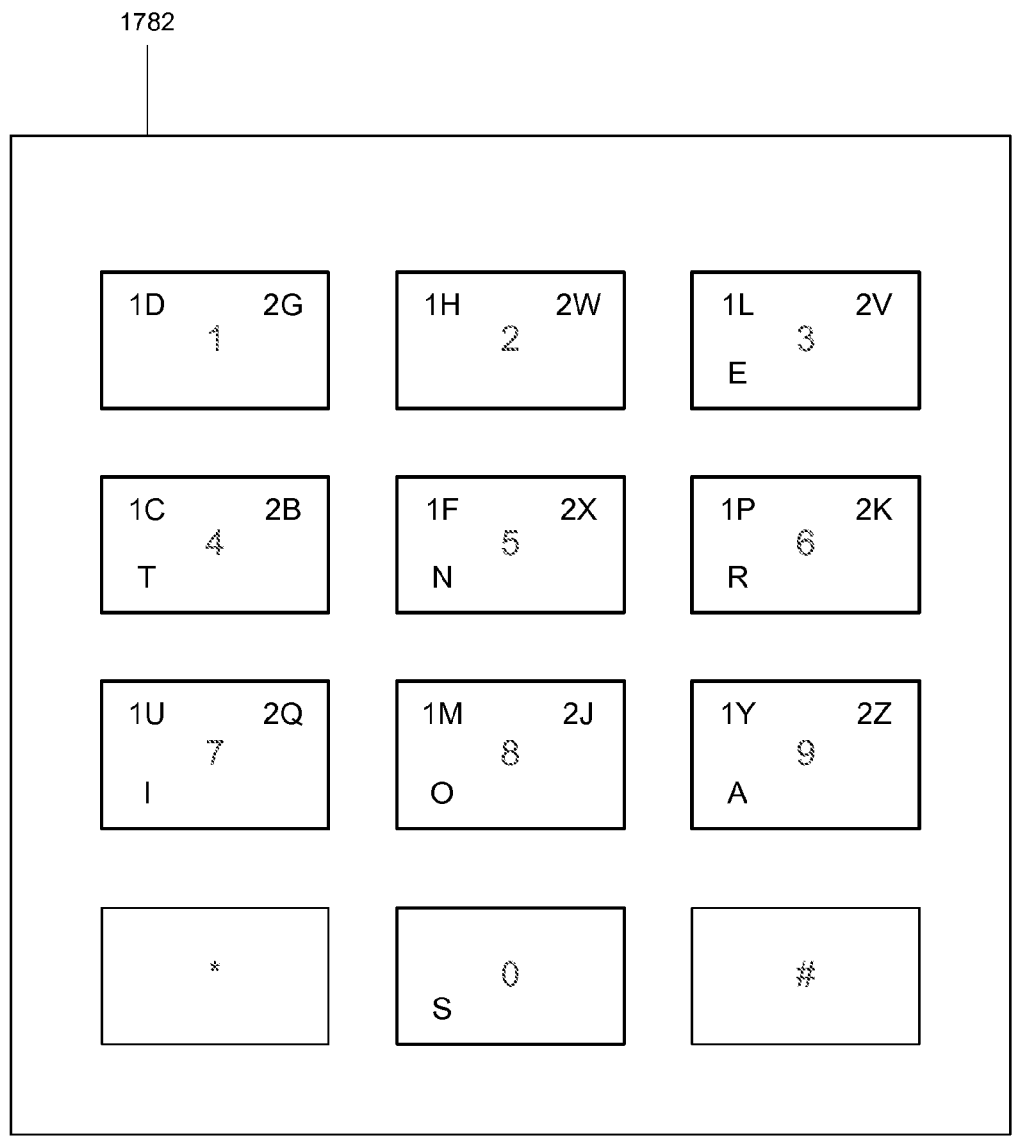
FIG. 11B shows, according to at least one embodiment of the present invention, an exemplary labeling for the buttons based on the embodiment shown in FIG. 8. A label with a single character indicates that pressing the corresponding key generates the character by itself. A label with a character with a prefix indicates that pressing the key corresponding to the prefix and the key in sequence generates the character in the label.
Figure 11C:
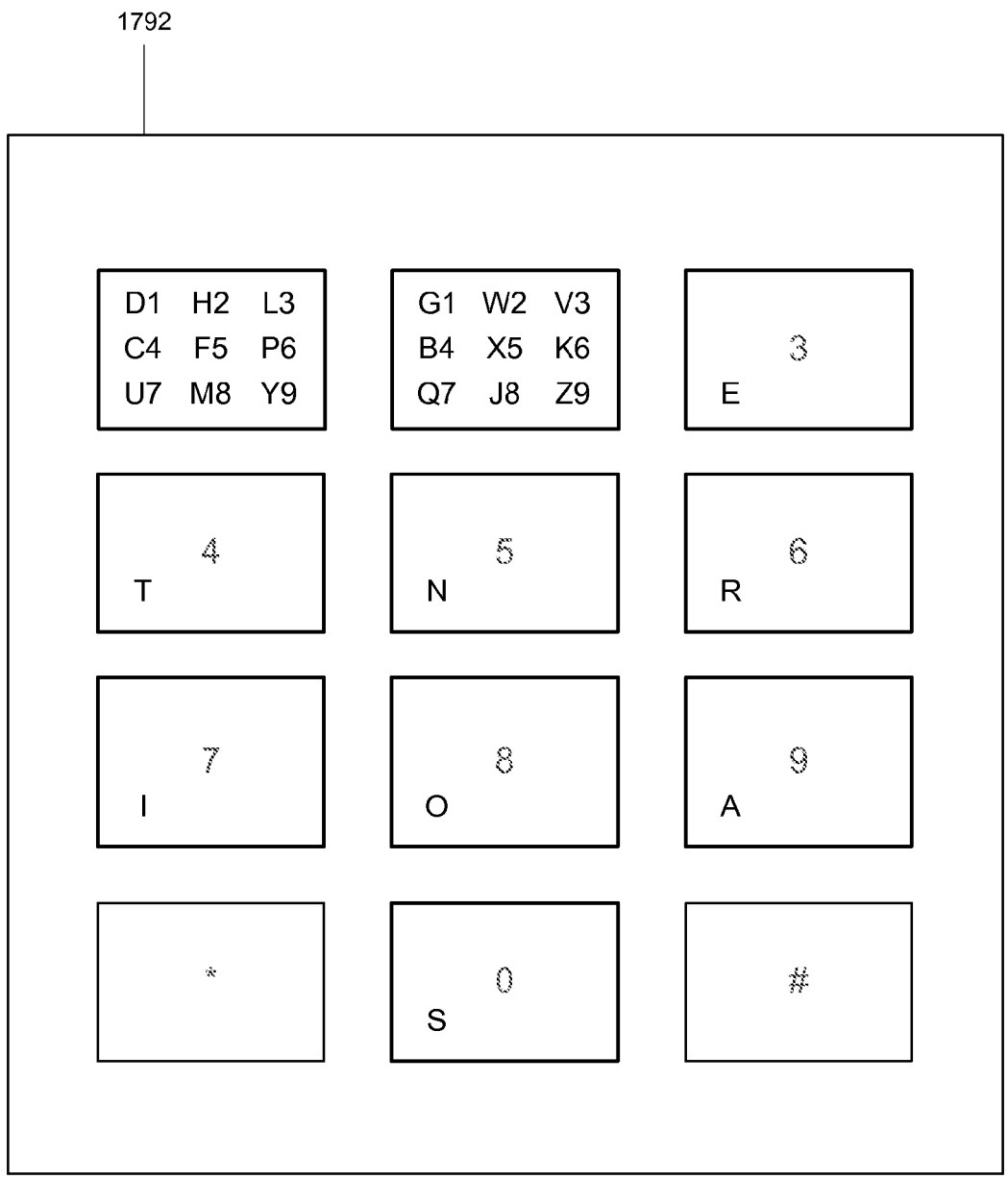
FIG. 11C shows, according to a certain embodiment of the present invention, an exemplary labeling scheme for the buttons using the character key sequence mapping of FIG. 8. A label with a single character indicates that pressing the corresponding key generates the character by itself. A label with a character with a postfix (e.g., one or more keys) indicates that pressing the key and the key corresponding to the postfix in sequence generates a signal corresponding to the character on the label.

Turning to FIG. 11, due to the fact that each key is potentially used for more than one character, various inventive methods are used to represent/present this mapping in an intuitive and/or user-friendly way. FIG. 11A shows one exemplary labeling of the keys for the keypad 1752 of the embodiment shown in FIG. 7. A label with a single character indicates that the corresponding key generates the character by itself. A label with a prefix indicates that the character in the label is generated when the key is pressed after the key or keys corresponding to the prefix are activated. For example, the label "33q" on the key "4" indicates that by pressing "3", "3", and "4" in that order, the character "q" is generated. FIG. 11B shows an exemplary labeling of the keys based on the embodiment of FIG. 8. A label with a single character on the keypad 1782 indicates that pressing the corresponding key generates the character by itself, as in the exemplary labeling of FIG. 11A. For instance, the character "e" is generated by pressing the key "3". A label with a character with a prefix indicates that pressing the key corresponding to the prefix and the target key in sequence generates the character in the label. For example, the character "g" is generated by pressing the key "2" and "1" in sequence. FIG. 11C illustrates, according to a certain embodiment of the present invention, an exemplary labeling method for the buttons using the character key sequence mapping of FIG. 8. A label with a single character indicates that pressing the corresponding key generates the character by itself. A label with a character with a postfix (e.g., one or more keys) indicates that pressing the key and the key corresponding to the postfix in sequence generates a signal corresponding to the character in the label.

Figure 12:
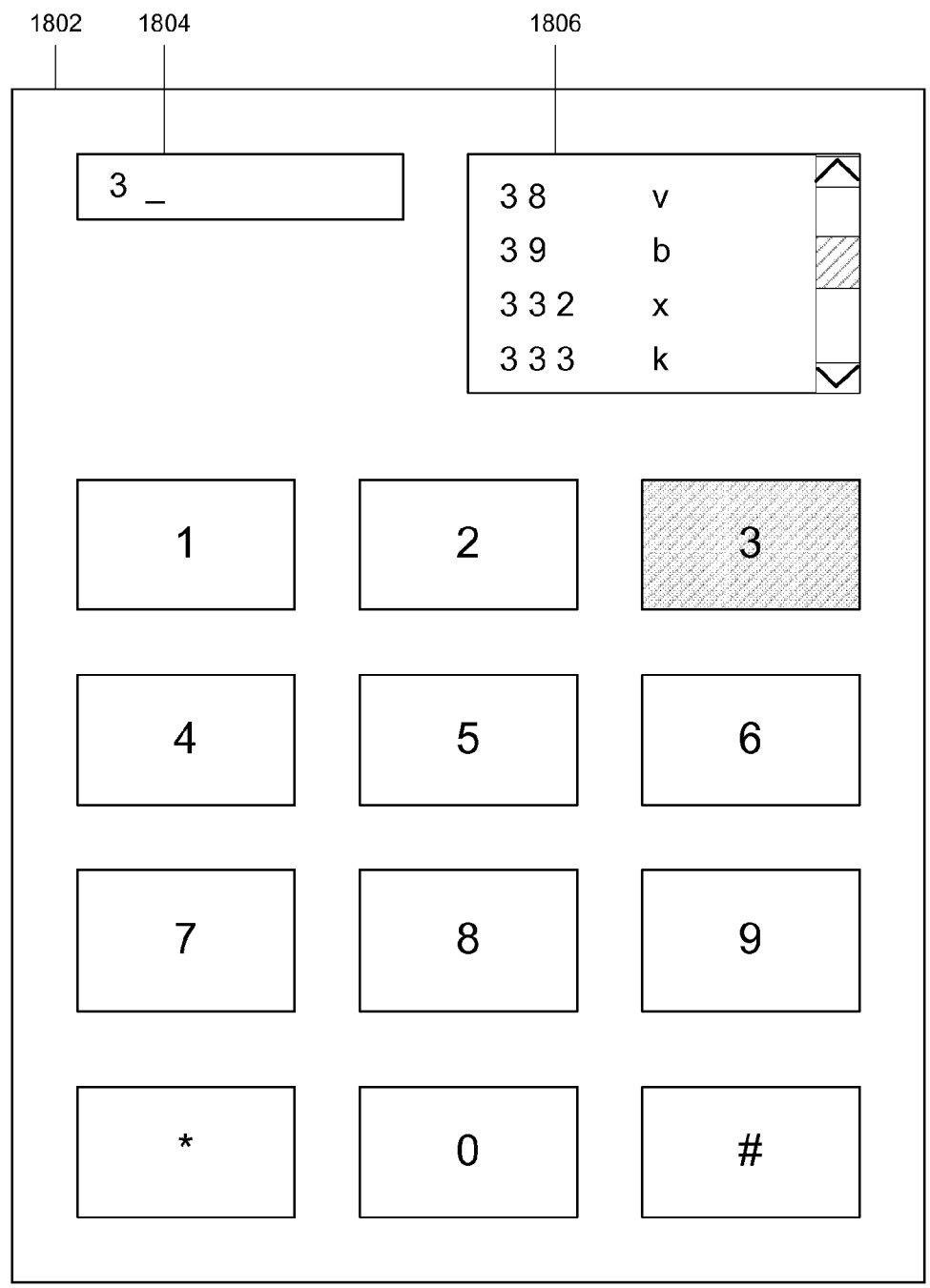
FIG. 12 illustrates an embodiment of the present invention with some kind of a typing aid. The display window on the top left-hand side shows the currently typed keys which have not been parsed corresponding to a valid character. The window on the top right-hand side displays all possible completions and the corresponding characters based on the currently typed keystrokes.

FIG. 12 illustrates a keyboard embodiment 1802 of the present invention that includes display screens, which may be used as a typing aid. The display window 1804 on the top left-hand side shows the currently typed keys which have not been parsed as a character. The window 1806 on the top right-hand side dynamically displays all possible completions and the corresponding characters based on the currently typed keys. In the example shown in the figure, the key "3" has been input so far (e.g., since the last valid keystroke sequence for a character was parsed, etc.), as shown in the window 1804. This will help the user remember key sequences for the desired character(s). According to an embodiment of the present invention, a main display screen of a device (e.g., an LCD display of a mobile phone, etc.) may be used for this purpose (e.g., instead of a separate display such as 1804 or 1806).

Figure 13:
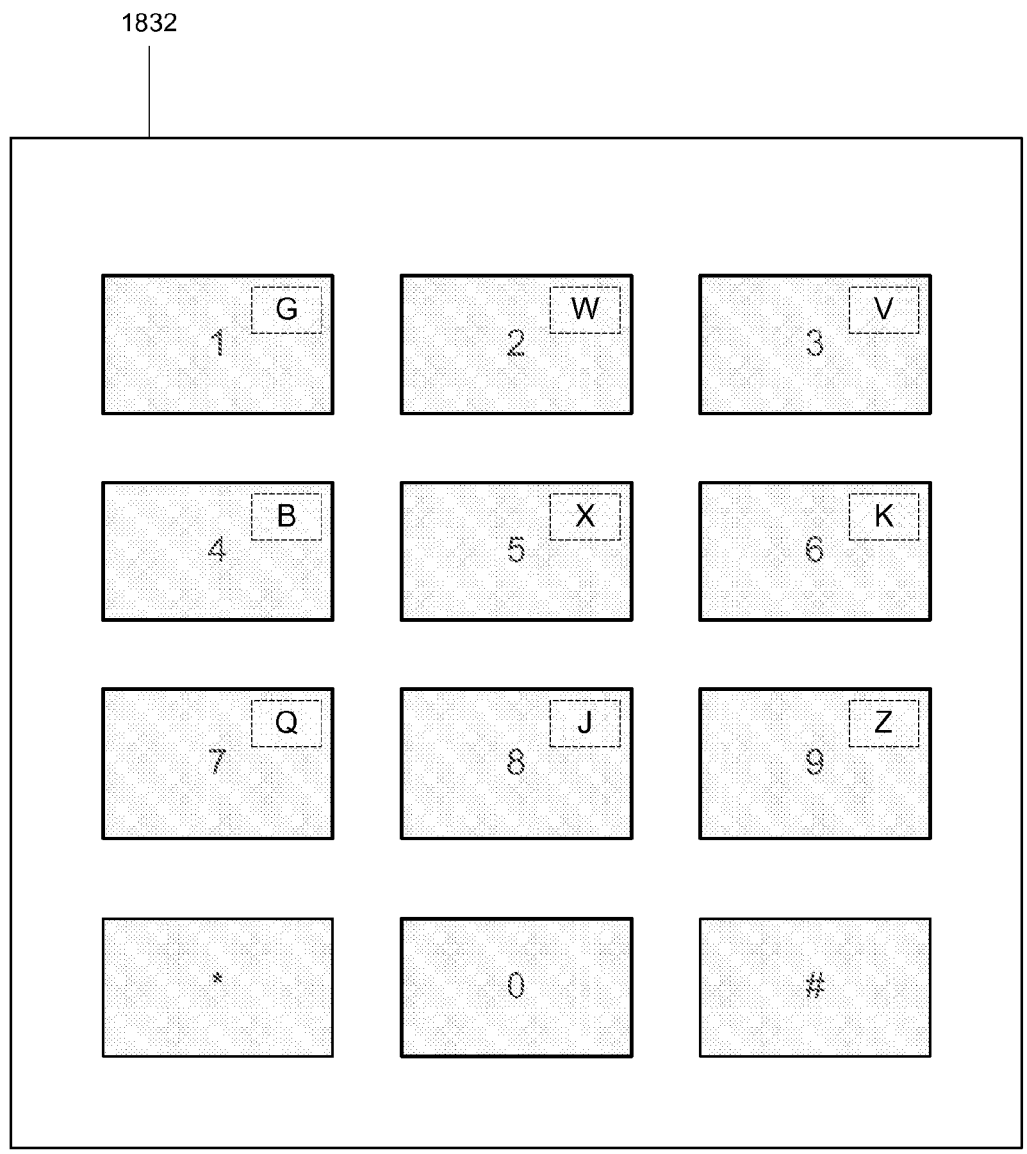
FIG. 13 shows a snapshot of a dynamic-label keyboard according to an embodiment of the present invention, based on the example of FIG. 8. The figure shows a snapshot after the user has pressed the key "2". This can be implemented, for example, by using LCD-screen keys in certain embodiments.
Figure 14A:
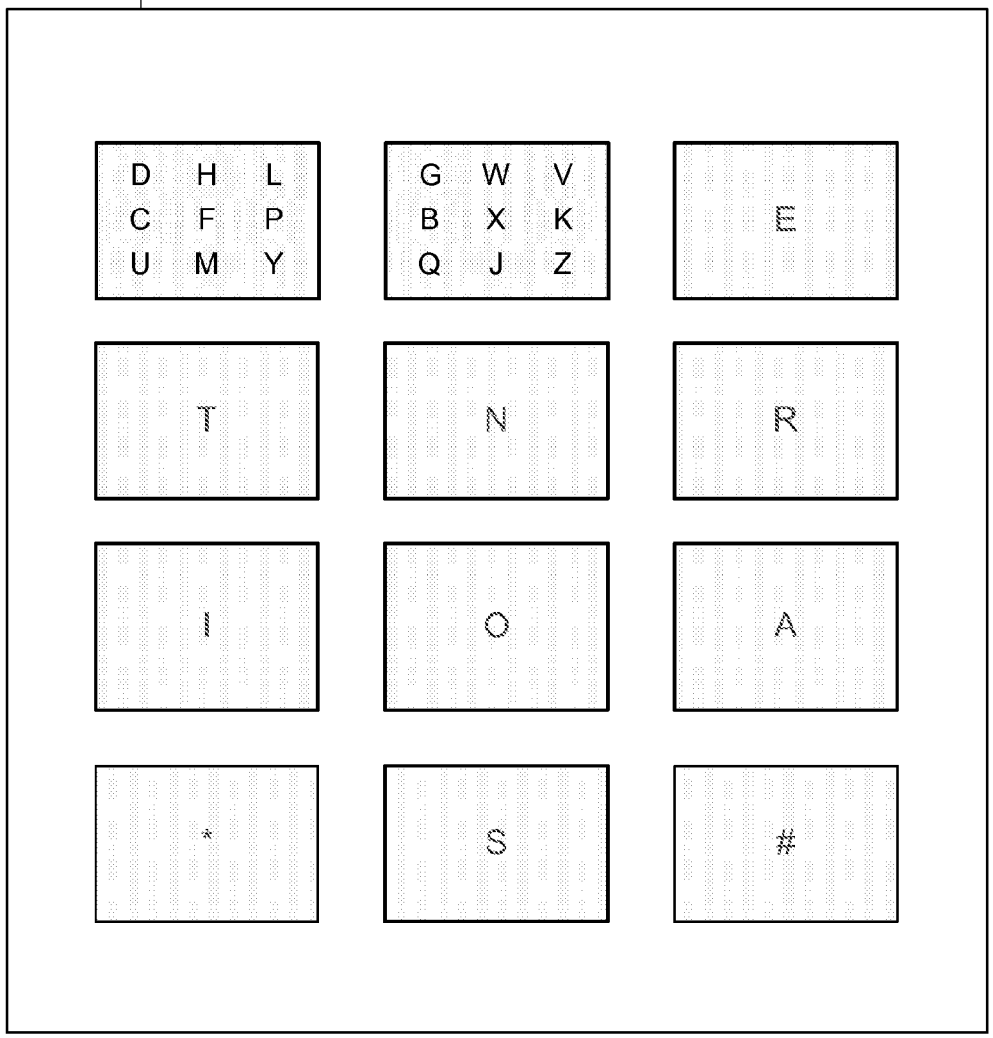
FIGS. 14A and 14B illustrate another exemplary dynamic-label keyboard according to some embodiments of the present invention.
Figure 14B:
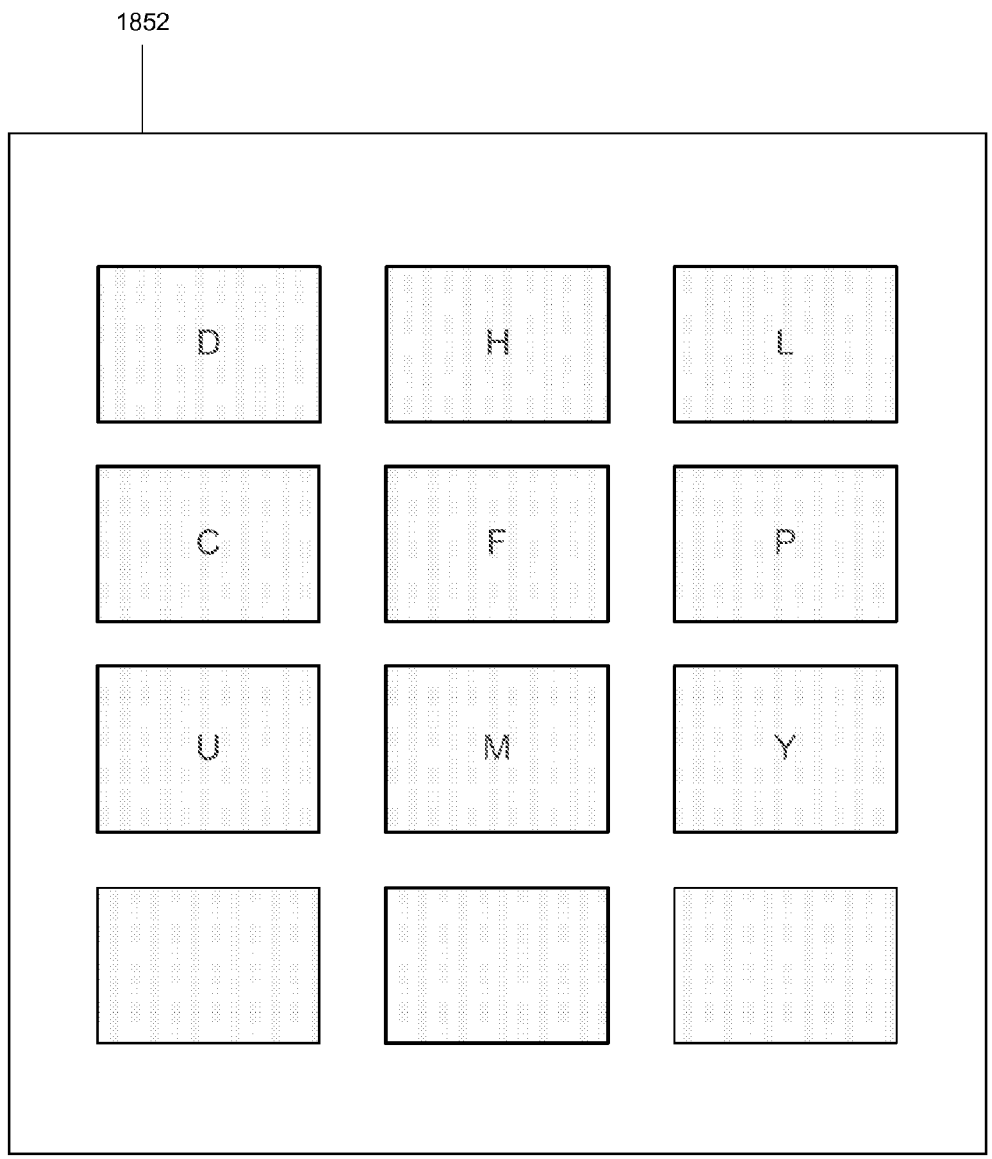

With reference to FIG. 13, certain keyboards of the present invention can be embodied using keys with dynamic labels. For example, array of LEDs (light emitting diodes) can be used on the key caps, or small LCD (liquid crystal display) screens can be embedded on top of the keys. The figure shows a snapshot of this dynamic-label keyboard 1832, based on the example of FIG. 8, after the user has pressed the key "2". Compare this with the embodiment shown in FIG. 1B. FIGS. 14A and 14B illustrate another exemplary dynamic-label keyboard according to some embodiments of the present invention. FIG. 14A shows a snapshot 1842 of keypad labels, in accordance with the exemplary embodiment of FIG. 8, before any key has been actuated (or, after all previous keystrokes have been parsed to characters, etc.). The relative position of each label on keys '1' and '2' represents the postfix key to generate the corresponding character. That is, to generate a letter 'H', the keys '1' and '2' need to be actuated in sequence. FIG. 14B shows another snapshot 1852 when the '1' key has been pressed. As stated, the letter 'H', for example, is now displayed on top of the key '2'. This scheme may be easily generalized to cases that require more than two keystrokes for certain characters. In some embodiments, key labels may be cyclically displayed to reduce clutter on small keytops.

Another ramification of using sequential keystrokes to represent a character is that, in many designs of this type of keyboard, there may be sequences of keys that do not map to any valid character in the character set. This can happen either because the user is not proficient or not familiar with the key sequence and character mapping or because of simple typing errors. One example of an error due to an invalid key sequence is shown in 1862 above the horizontal line in FIG. 15. The example is based on the embodiment of FIG. 7, and it shows the (invalid) key sequence "337" for the character "z". The correct sequence is "336", as shown in table 1582 of FIG. 7B. Note that the key sequence "36" is mapped to the character "g", and "6" is mapped to "n". From the error alone, without looking at the translation 1864, it may not be clear that this error is due to mistyping of "336" or due to extra keystroke "3" (e.g., before the valid sequence "36") or "33" (e.g., before the valid "6").

When a user types a key sequence that has no corresponding character, an error handling routine is invoked. In one embodiment, simply an error message is displayed and the user is given a chance to correct the error. In another embodiment, all keystrokes from the last known character boundary is deleted, possibly with warning messages or beeps. In yet another embodiment, only the last key is deleted, again with an optional warning. In yet another embodiment, all keystrokes up to the point of error is simply ignored, possibly with warning, and it accepts the next keystrokes. A special character indicating an error may be included in place of the incorrect keystrokes. This type of implementation can be useful for touch typists who are capable of typing fast (e.g., typing without looking at what he or she is actually typing, as displayed on the display screen, etc.). In some cases, especially for designs geared toward proficient typists or data entry people, re-synchronization of key sequences may need to be implemented. These constructs are typically used when prefix-free coding, or variable-length encoding in general, are used for data communications. According to a certain embodiment of the present invention, a special input (e.g., a re-synchronization symbol/marker) is used (e.g., by a user, etc.) such that when it is invoked all immediately preceding keystrokes, if any, that do not correspond to a character are ignored and the subsequent keystrokes are used for a new character signal.

Figure 16:
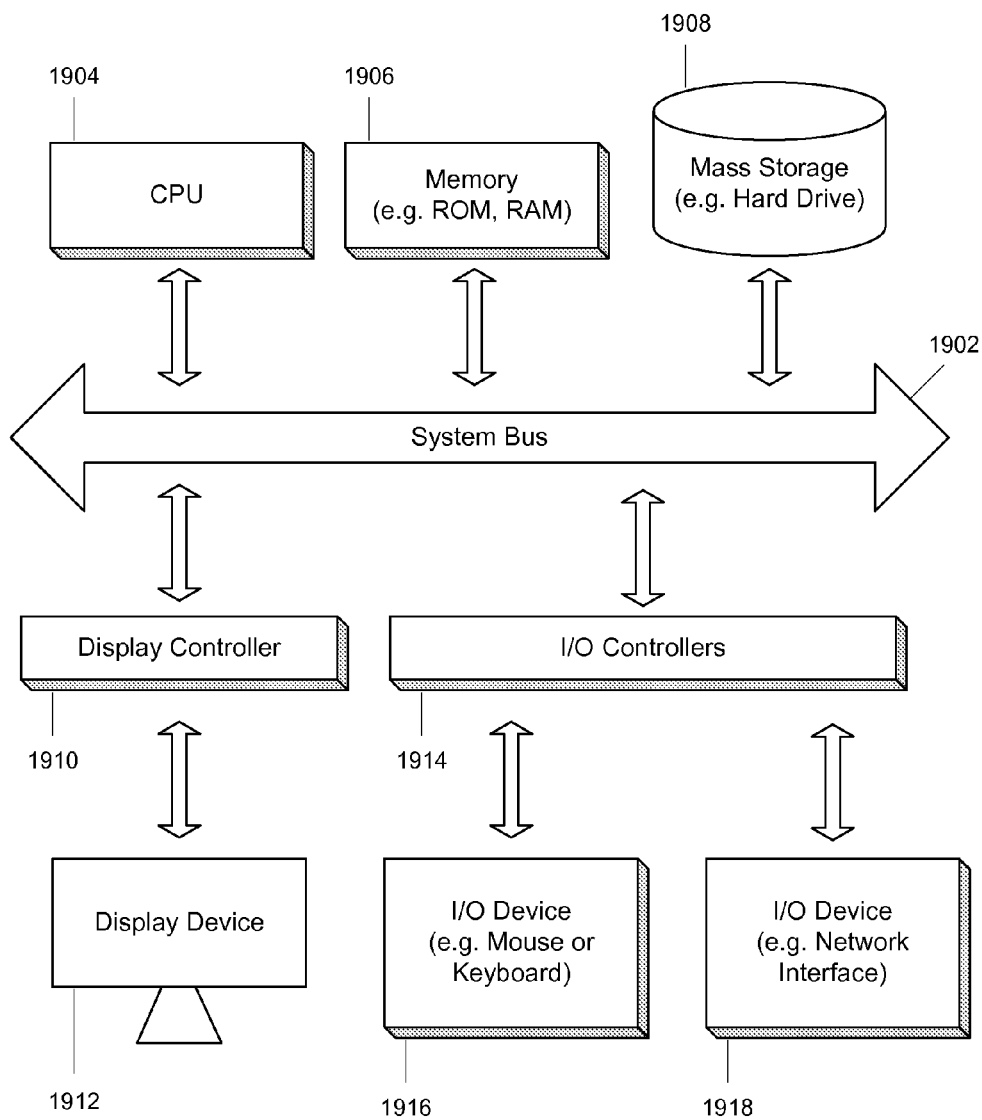
FIG. 16 shows an exemplary (general-purpose) data processing system with which various embodiments of the present invention can be practiced.

FIG. 16 shows a block diagram illustrating various components of an exemplary data processing system such as a personal computer (PC) with an external keyboard, or a mobile phone with a built in keypad, with an embedded microcontroller and/or memory, etc., with which embodiments of the present invention can be practiced. This and other data processing or communications systems may be used with various embodiments of the present invention. As will be appreciated by one of skill in the art, however, the present invention may be embodied as a method, data processing system or program product as well as an article of manufacture or an apparatus. Thus the scope of the invention should be determined by the appended claims and their legal equivalents, and not by the examples given. Note that while the block diagram of FIG. 16 illustrates various components of a data processing system, it is not intended to represent any particular architecture or manner of interconnecting the components. It will also be appreciated that personal computers, laptops, and network computers, and other data processing systems such as cellular telephones, personal digital assistants (PDAs), digital media players, etc. which have fewer components or perhaps more components may also be used with the present invention.

As shown in FIG. 16, the exemplary data processing system includes at least one bus 1902 which is coupled to a microprocessor(s) or a microcontroller(s) 1904 and a memory 1906 such as a ROM (read only memory) or a volatile RAM (random access memory) and a non-volatile storage device(s) 1908. The system bus 1902 interconnects these various components together and also interconnects these components 1904, 1906, and 1908 to a display controller(s) 1910 and a display device(s) 1912 such as LCD (liquid crystal display) screens and to peripheral devices such as input/output (I/O) devices 1916 and 1918 which may be mice, keyboards, input wheels, modems, network interfaces, printers and other devices which are well known in the art. Typically, the I/O devices 1916 and 1918 are coupled to the system through I/O controllers 1914. The volatile RAM 1016 is typically implemented as dynamic RAM (DRAM) which requires power continually in order to refresh or maintain the data in the memory. The mass storage 1908 is typically a magnetic hard drive or a magnetic optical drive or an optical drive or a DVD ROM or other types of memory systems which maintain data (e.g. large amounts of data) even after power is removed from the system. Typically, the mass storage 1908 will also be a random access memory although this is not required. While FIG. 16 shows that the mass storage 1908 is a local device coupled directly to the rest of the components in the data processing system, it will be appreciated that the present invention may utilize a non-volatile memory which is remote from the system, such as a network storage device which is coupled to the data processing system through a network interface 1918 such as a modem or Ethernet interface. The bus 1902 may include one or more buses connected to each other through various bridges, controllers and/or adapters as is well known in the art. In one embodiment, the I/O controller 1914 includes a USB (universal serial bus) adapter for controlling USB peripherals and an IEEE 1394 ("firewire") controller for IEEE 1394 compliant peripherals. The display controllers 1910 may include additional processors such as GPUs (graphical processing units) and they may control one or more display devices 1912.

Figure 17:
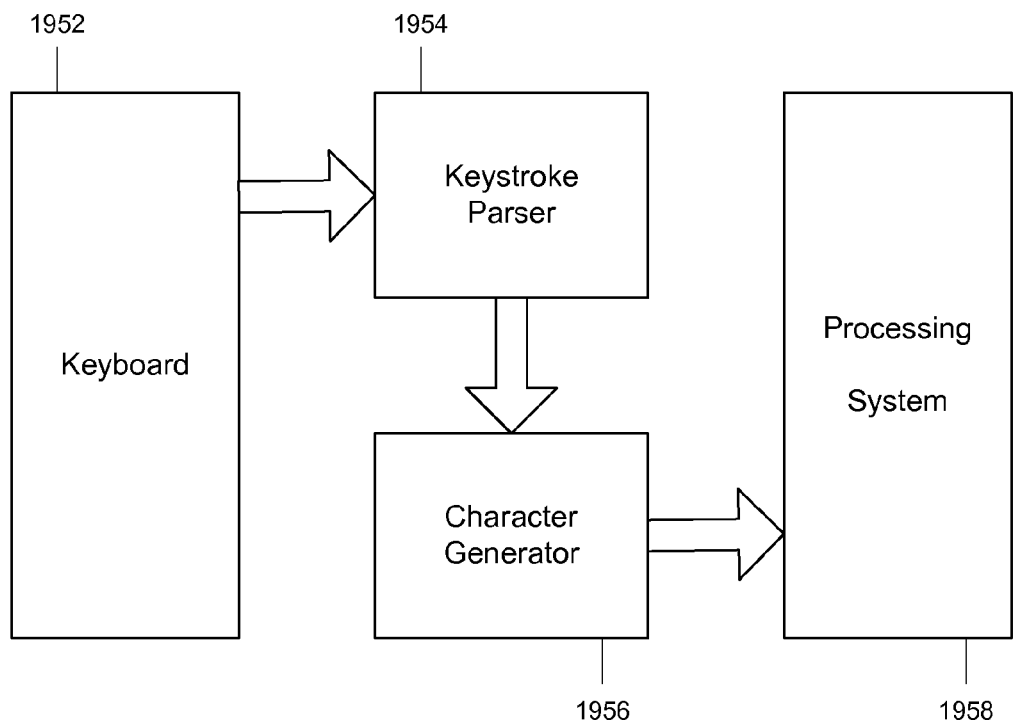
FIG. 17 illustrates certain components/modules of an exemplary system, in a block diagram form, according to an embodiment of the present invention.

With reference to FIG. 17, the block diagram in the figure illustrates certain components or modules of an exemplary system according to an embodiment of the present invention. This exemplary system may be embodied in the context of the data processing system of FIG. 16. In this (simplified) diagram, keystrokes received/generated from a keyboard 1952 (either built-in or external, etc.) are processed by units/modules 1954 and 1956 before they are consumed by a processing unit/module 1958. The parser module 1954 (or, a key signal detector circuit, etc.) is responsible for parsing keystrokes (e.g., based on a predefined mapping table between keystroke sequences and characters) in this particular embodiment. It may also include (or, is coupled to) an error handling module, for example, as shown in FIG. 6. The translator/generator module 1956 (or, a character signal generator circuit, etc.) then generates the character corresponding to the received keystrokes, which is fed into the main processing unit 1958. It should be noted that this is only a schematic illustration of an exemplary embodiment. For instance, the functionalities of the keystroke-parsing/character-generating modules may be built into a keyboard 1952 in certain embodiments. They may also be included in a data processing system 1958 in certain other embodiments (e.g., as a part of keyboard device driver, or in an application program, etc.). All four components may be comprised in one device (e.g., "smart keyboard"). Other implementations are also possible, as will be clear to a person of skill in the pertinent art, based on the current disclosure. As illustrated earlier, these modules 1954 and/or 1956 may contain memories for storing partial keystroke sequences or characters, etc. In some embodiments, the translator module 1956 contains a memory or buffer for storing states of various modifier keys. The characters generated may depend on the states of relevant modifier keys as well as the currently received keystroke sequence, as explained earlier.

Figure 18:
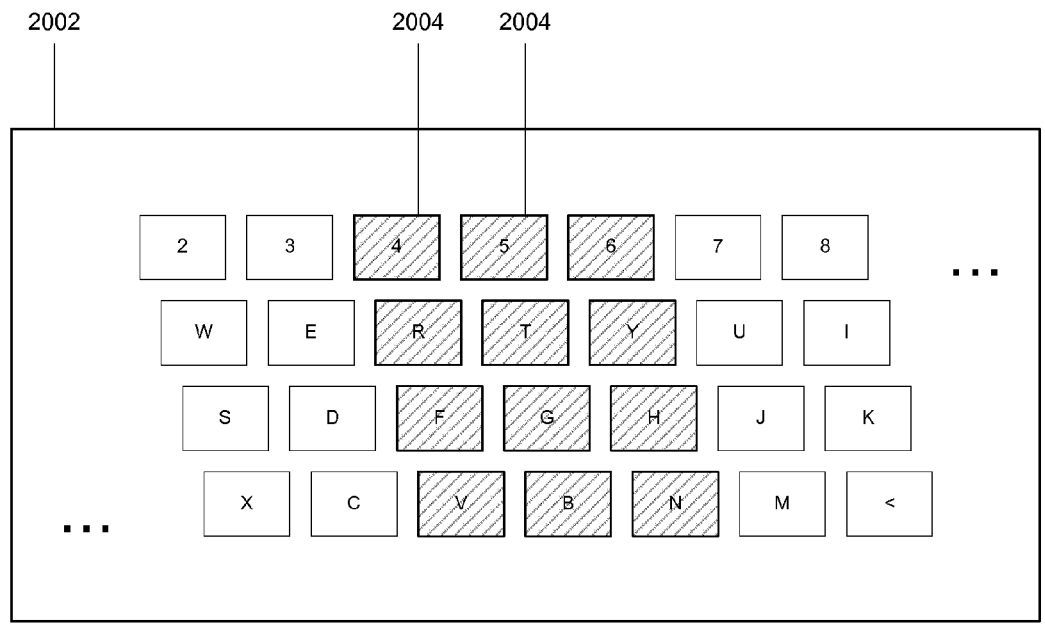
FIG. 18 illustrates an embodiment of the present invention implemented as a part of a conventional (e.g., non-sequential, etc) keyboard such as the QWERTY type. Any section consisting of a certain number of keys can be used for this purpose. One or more additional buttons may be used for switching modes between normal and sequential-keystroke operations. Or, the mode switching can be done using software mechanisms, either specific to particular application being used or common to all applications running on the given operating system or the virtual machine (or, specific to a user, etc.).

As alluded earlier, and as will be appreciated by one of skill in the art, the present invention can be embodied in many different forms. Accordingly, the present invention may take the form of an entirely hardware embodiment, an entirely software embodiment or an embodiment combining software and hardware aspects. For example, it can be embodied as a kernel-level device driver (or, as an application-layer software component, etc.) for conventional keyboards for personal computers. This is illustrated in FIG. 18, where a rectangular section of a conventional QWERTY keyboard 2002 (or, a non-sequential keystroke keyboard) is used to implement an embodiment of the invention. The twelve shaded keys 2004 may directly correspond to 12 numeric keys of, for example, the embodiment shown in FIG. 9A. In this embodiment, a means to change modes between the normal operation and sequential keystroke operation for the selected keys may be provided. In devices like tablet PCs or other devices with touch screens, the present invention may also be embodied as a virtual keyboard, which is typically shown on a screen, sometimes as a separate application in a floating window or as a semi-transparent application. In simple touch screens, one or more fingers can be used to operate such embodiments.

Figure 19:
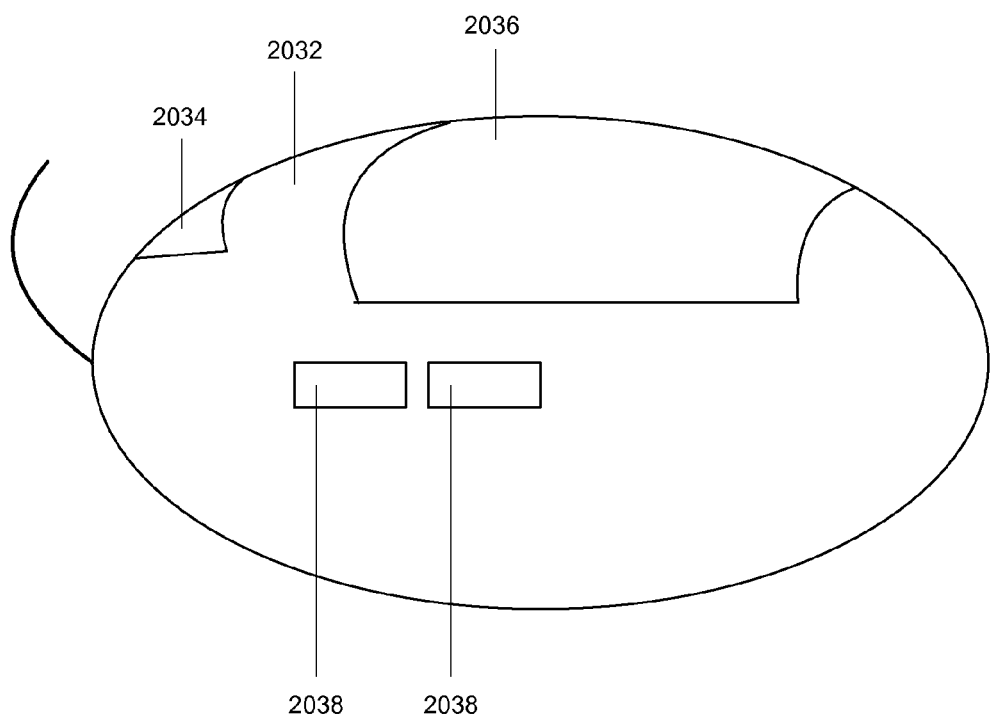
FIG. 19 shows a computer peripheral device according to a certain embodiment of the present invention, in which functions of both a conventional pointing device and a sequential-keystroke keypad are integrated into a single unit. The figure illustrates a rectangular keypad consisting of multiple keys embedded on the top of a computer mouse. Additional functional keys and mouse buttons, and the like, are also shown in the figure.

The present invention will be most useful when one-handed operation of keyboard is more natural or otherwise required. For example, small devices like remote controls for television sets or VCRs are often operated by one hand. When it is necessary to input alphabetical letters through remote control units, certain embodiments of the present invention can be operated by a finger/thumb of one hand. Likewise, many input panels used in consoles of automobiles need to be operated by one hand and the present invention can be effectively used in such environments. Even in situations where both hands of the user can be used, it is sometimes convenient just to use one hand to input short series of characters. For example, while using a personal computer with graphical user interfaces it is often necessary to move hands back and forth between keyboards and pointing devices such as computer mice. In such a case, if some characters can be input from a mouse, for example, many unnecessary activities may be spared. FIG. 19 shows one such exemplary embodiment. In the figure, a keypad 2036 such as shown in FIG. 7A, 8A, or 9A, is integrated into the top of a mouse device 2032. The keypad may be operated as a sequential keystroke keyboard according to an embodiment of the present invention. A pointing device typically comprises a motion sensor for generating position-based input signals. The mouse shown in the figure contains the conventional buttons and/or wheels 2034. But, in addition, it includes additional buttons 2038 to support the keypad functionalities or to switch between various operating modes. The integrated device such as that shown in FIG. 19 might be operated in a few different modes. For example, the device can be put into one of the following three states: (a) a state where the device can be used both as a keyboard and a mouse, which may be referred to as Auto, (b) a Keyboard-Only state, or (c) a Mouse-Only state. In a state where more than one operating modes are allowed (e.g., (a)), a special button may be used to temporarily disable (or enable) one or the other mode.

Figure 20A:
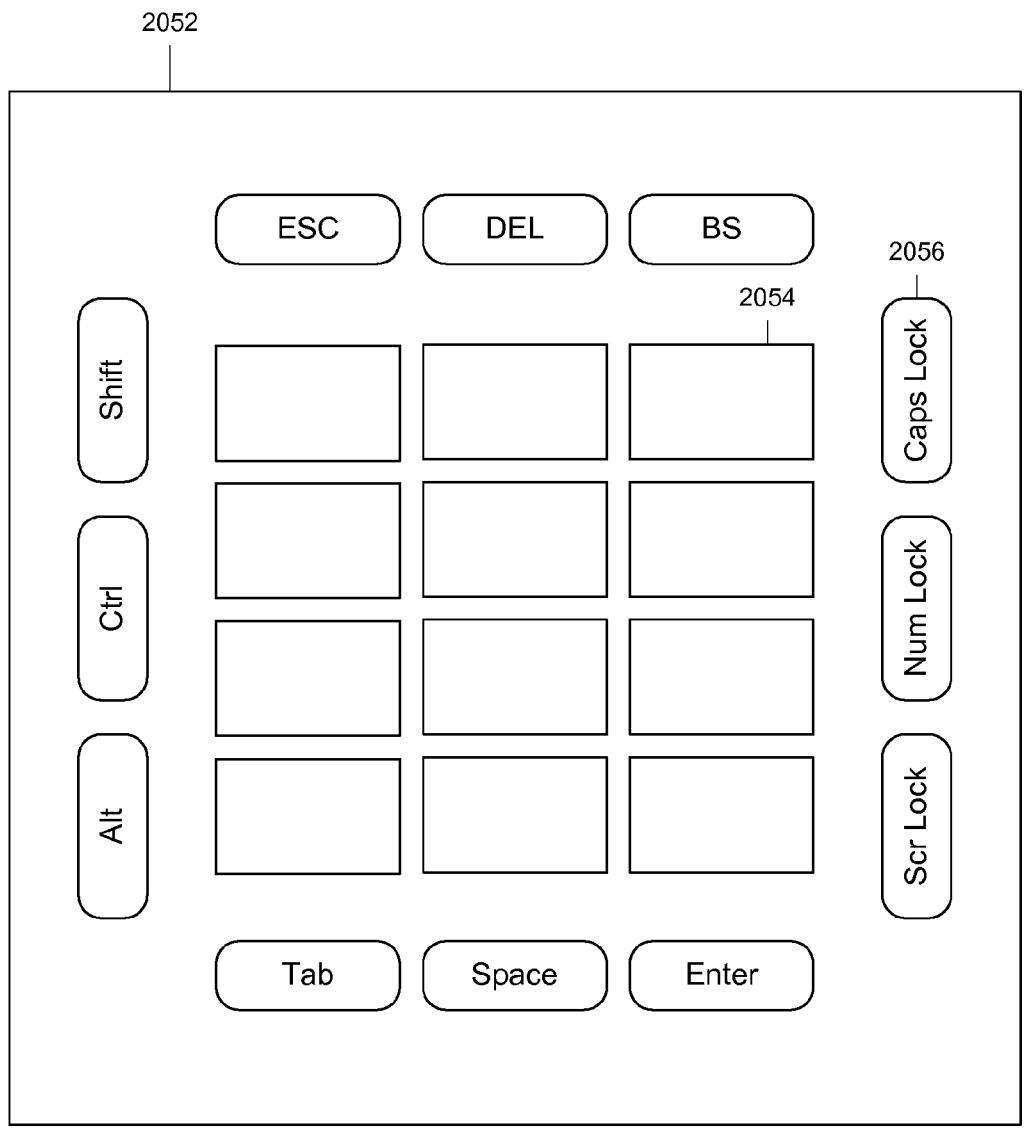
FIG. 20A shows a top view of an exemplary keypad according to an embodiment of the present invention. The keypad comprises twelve keys in the center area which are primarily used for sequential-keystroke operations, and it further includes additional keys placed on the peripheral area.
Figure 20B:
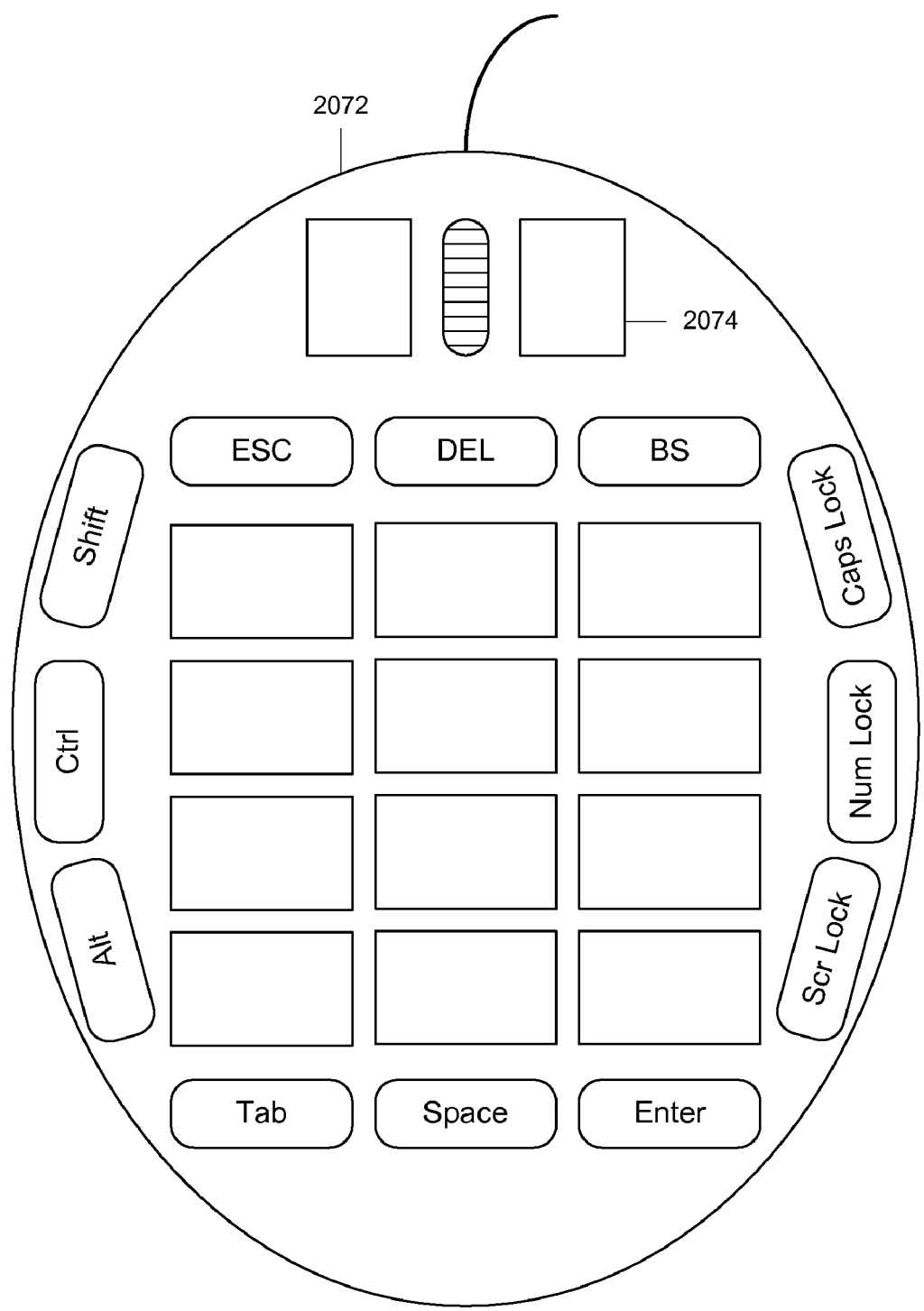
FIG. 20B schematically shows a top view of another exemplary keypad according to a certain embodiment of the present invention. The keypad comprising multiple keys similar to that shown in FIG. 20A is disposed on top of a pointing device, e.g., a mouse.

FIG. 20A shows a top view of an exemplary keypad or an input device 2052 according to an embodiment of the present invention. The keypad comprises twelve keys 2054 in the center area which are primarily used for sequential-keystroke operations, and it further includes additional keys 2056 placed on the peripheral area. In particular, it comprises three white space keys for Space, Tab, and Enter, and three modifier keys, Ctrl, Alt, and Shift. It further comprises Escape, Delete, and Backspace keys, and Scroll Lock, Num Lock, and Caps Lock, as are typically found in a PC keyboard. In certain embodiments of the present invention, one or more of these "peripheral" buttons may be used to switch modes of the keypad, e.g., between a text mode and a number mode, etc. In some embodiments, the keypad may be operated as a sequential-keystroke keyboard in one operating mode, and it may be used as a multi-tap mode in another operating mode, etc. FIG. 20B schematically shows a top view of another exemplary input device 2072, including a keypad, according to a certain embodiment of the present invention. The keypad comprising multiple keys similar to that shown in FIG. 20A is disposed on top of a pointing device, e.g., a mouse. The device includes "mouse buttons" 2074 as well as keys for inputting character-based data. This particular key arrangement shown in the figure may be more suitable for the right hand use. (For example, the modifier keys Shift, Ctrl, and Alt are placed on the left hand side of the device so that they can be operated by a thumb of the right hand, etc.) However, other arrangements of keys are also possible. According to an embodiment of the present invention, certain modifier keys may be used either in sticky or non-sticky mode. When a modifier key is used in a sticky mode, the modifier key need not be pressed simultaneously with the key (or, key sequence) being modified (e.g., like a prefix key). In a certain embodiment, when a valid keystroke sequence has been parsed (e.g., to a character), the modifier key may be automatically "released". In a certain other embodiment, an explicit action (e.g., one more press, etc.) may be needed to "disengage" the pressed modifier key (e.g., such as when operating a Caps-Lock key, etc.).

Thus, among other things, methods and apparatuses for designing a character input device for efficient data entry have been provided. A user inputs data from a predefined set of characters on an input device with a limited number of keys by pressing one or more keys, in a sequential fashion, for each character. According to an embodiment of the present invention, Huffman coding is used to generate an optimal key sequence for a given character based on the frequency of occurrence for each character. The present invention enables the user to efficiently input typical data from a given probability distribution of characters using a limited number of keys. In some embodiments, certain inventive devices may be operated by a single hand of a user (e.g., using a finger or a thumb). While the above description contains many specificities, these should not be construed as limitations on the scope of the invention, but as exemplifications of the presently preferred embodiments thereof. Many other ramifications and variations are possible within the teachings of the invention. For example, certain embodiments of the present invention may be generalized by using multigram frequency tables instead of a single character (unigram) frequency table, and by designing keystroke sequences for multigrams (e.g., bigrams, trigrams, etc.) of alphabets or other letters, symbols, etc. As will be appreciated by one of skill in the art, the present invention may be embodied as a method, data processing system or program product. Accordingly, the present invention may take the form of an entirely hardware embodiment, an entirely software embodiment or an embodiment combining software and hardware aspects. Furthermore, the present invention may take the form of a computer program product on a computer-readable storage medium having computer-readable program code means embodied in the medium. Any suitable storage medium may be utilized including hard disks, CD-ROMs, DVD-ROMs, optical storage devices, or magnetic storage devices. Thus the scope of the invention should be determined by the appended claims and their legal equivalents, and not by the examples given.

What is claimed is:

1. A method for designing a keyboard for inputting characters from a set of characters, the keyboard having a plurality of keys, the method comprising:

assigning a first weight to a first character from the set of characters;

assigning a second weight to a second character from the set of characters; and generating, using a prefix-free encoding, a first keystroke sequence for said first character and a second keystroke sequence for said second character based on said first weight and said second weight.

2. The method of claim 1, wherein:
the plurality of keys comprises at least eight keys.

3. The method of claim 1, wherein:
the set of characters comprises alphanumeric characters.

4. The method of claim 1, wherein:
a first number of keys from the plurality of keys is substantially less than a second number of characters in the set of characters.

5. The method of claim 1, wherein:
said first weight and said second weight are determined based on a first frequency of occurrence of said first character and a second frequency of occurrence of said second character over a predetermined lexical domain.

6. The method of claim 1, wherein:
said prefix-fee encoding comprises Huffman coding.

7. The method of claim 1, wherein:
at least one of said first keystroke sequence and said second keystroke sequence comprises a sequence of at least two keystrokes.

8. The method of claim 1, wherein:
said generating further comprises:
grouping each character in the set of characters into a plurality of groups and performing said generating for each of said plurality of groups.

9. The method of claim 1, further comprising:
arranging keys of the plurality of keys on the keyboard, said arranging comprises arranging at least two keys on the keyboard based on said first keystroke sequence and said second keystroke sequence.

10. A machine readable medium, the machine readable medium containing machine executable program instructions which, when executed by a data processing system, causes the data processing system to perform a method for generating characters from a set of characters, the data processing system being coupled to a keyboard, the keyboard being configured to generate keystroke sequences from a plurality of keys, the method comprising:
generating a first signal for a first character when a first keystroke sequence is inputted, said first keystroke sequence being included in a table comprising a plurality of entries, wherein each entry of said table comprises a mapping associating a keystroke sequence with a character from the set of characters, wherein said first character corresponds to said first keystroke sequence according to said table, wherein there exists an entry in said table comprising another keystroke sequence which has a different length from said first keystroke sequence, and wherein said table is generated such that dividing said keystroke sequence into a first subsequence and a second subsequence does not result in said first subsequence being a valid keystroke sequence in said table if said first subsequence comprises at least one keystroke and said second subsequence comprises at least one keystroke.

11. The machine readable medium of claim 10, wherein:
at least one of said plurality of entries comprises a mapping associating one keystroke sequence with a plurality of characters from the set of characters, wherein one of said plurality of characters is generated, when said one keystroke sequence is received, based on a state of a modifier key on the keyboard.

12. The machine readable medium of claim 10, wherein:
said first keystroke sequence comprises a sequence of at least two keystrokes.

13. The machine readable medium of claim 10, wherein:
said generating comprises generating said first signal without additional cue, wherein said additional cue comprises at least one of (a) a pause of substantially non-zero interval, or (b) another keystroke.

14. The machine readable medium of claim 10, the method further comprising:
generating a second signal for a second character when a second keystroke sequence is inputted, said second keystroke sequence being included in said table, said second character corresponding to said second keystroke sequence according to said table.

15. A data input system for generating character signals from a set of characters, the system comprising:
a keyboard comprising a plurality of keys;
a key signal detector coupled to said keyboard, said key signal detector being configured for detecting a keystroke of a key from said plurality of keys; and
a character signal generator coupled to said key signal detector, said character signal generator being configured for generating a character signal when a keystroke sequence from a plurality of predefined key sequences is detected, wherein said plurality of predefined key sequences is generated using a variable-length prefix-fee encoding.

16. The data input system of claim 15, wherein:
said detecting comprises detecting at least one of (a) a key press of said key, (b) a key release of said key, or (c) a key press and release of said key.

17. The data input system of claim 15, wherein:
said character signal generator comprises a memory for storing a currently received keystroke sequence.

18. The data input system of claim 15, wherein:
said character signal generator is configured to generate another character signal when said keystroke sequence is received with a different modifier key state.

19. The data input system of claim 15, wherein:
said character signal generator is configured such that an error message is generated if a currently received keystroke sequence does not correspond to any of said plurality of predefined keystroke sequences.

20. The data input system of claim 15, wherein:
said prefix-free encoding comprises Huffman coding based on a frequency of occurrence of each character from said set of characters.

* * * * *